(12) United States Patent
Kurita et al.

(10) Patent No.: US 6,176,668 B1
(45) Date of Patent: Jan. 23, 2001

(54) IN-SITU SUBSTRATE TRANSFER SHUTTLE

(75) Inventors: Shinichi Kurita, San Jose; John M. White, Hayward, both of CA (US)

(73) Assignee: Applied Komatsu Technology, Inc., Tokyo (JP)

( * ) Notice: Under 35 U.S.C. 154(b), the term of this patent shall be extended for 0 days.

(21) Appl. No.: 09/082,488

(22) Filed: May 20, 1998

(51) Int. Cl.⁷ .................................................. B65G 49/07
(52) U.S. Cl. ........................ 414/217; 414/939; 198/346.2
(58) Field of Search .............................. 414/217, 331.11, 414/417, 609, 749.3, 785, 939; 198/346.2

(56) References Cited

U.S. PATENT DOCUMENTS

| | | | |
|---|---|---|---|
| 3,973,665 | * | 8/1976 | Giammanco ...................... 414/217 X |
| 3,976,330 | | 8/1976 | Babinski et al. ...................... 302/2 R |
| 4,047,624 | | 9/1977 | Dorenbos ................................ 214/17 |
| 4,449,885 | * | 5/1984 | Hertel et al. ................... 198/346.2 X |
| 4,492,301 | * | 1/1985 | Inaba et al. ......................... 198/346.1 |
| 4,558,984 | * | 12/1985 | Garrett .......................... 198/346.2 X |
| 4,775,281 | | 10/1988 | Prentakis ................................. 414/416 |
| 4,856,641 | * | 8/1989 | Matsumura et al. ............. 414/417 X |
| 4,951,601 | | 8/1990 | Maydan et al. ......................... 118/719 |
| 4,985,722 | | 1/1991 | Ushijima et al. ...................... 354/319 |
| 5,001,327 | | 3/1991 | Hirasawa et al. .................... 219/390 |
| 5,060,354 | | 10/1991 | Chizinsky ............................ 29/25.02 |
| 5,086,729 | * | 2/1992 | Katagiri ............................. 414/217 X |
| 5,110,249 | | 5/1992 | Norman ................................. 414/217 |
| 5,187,115 | | 2/1993 | Coleman ............................... 437/101 |
| 5,215,420 | * | 6/1993 | Hughes et al. .................... 414/417 X |
| 5,227,708 | | 7/1993 | Lowrance ............................... 318/640 |
| 5,252,807 | | 10/1993 | Chizinsky .............................. 219/390 |
| 5,259,883 | | 11/1993 | Yamabe et al. ....................... 118/725 |
| 5,288,379 | | 2/1994 | Namiki et al. ......................... 204/192 |
| 5,330,301 | * | 7/1994 | Brancher ................................ 414/417 |
| 5,355,066 | | 10/1994 | Lowrance .............................. 318/640 |
| 5,417,537 | * | 5/1995 | Miller .................................... 414/217 |
| 5,447,409 | | 9/1995 | Grunes et al. ....................... 414/744.6 |
| 5,469,035 | | 11/1995 | Lowrance ........................ 318/568.22 |
| 5,470,784 | | 11/1995 | Coleman ................................ 437/101 |
| 5,512,320 | | 4/1996 | Turner et al. ......................... 427/255 |
| 5,535,306 | | 7/1996 | Stevens ................................... 395/89 |
| 5,536,128 | | 7/1996 | Shimoyashiro et al. ............. 414/273 |
| 5,537,311 | | 7/1996 | Stevens ........................... 364/167.01 |
| 5,607,009 | | 3/1997 | Turner et al. ........................... 165/48 |
| 5,609,689 | | 3/1997 | Kato et al. ............................. 118/719 |
| 5,658,114 | * | 8/1997 | Mahler ................................. 414/217 |
| 5,674,786 | | 10/1997 | Turner et al. ......................... 437/225 |
| 5,701,627 | | 12/1997 | Matsumura et al. ................... 15/88.2 |
| 5,823,736 | * | 10/1998 | Matsumura .......................... 414/609 |

FOREIGN PATENT DOCUMENTS

| | | |
|---|---|---|
| 2114470 | 9/1972 | (DE) . |
| 0 359 525 A2 | 3/1990 | (EP) . |
| 0 608 633 A2 | 8/1994 | (EP) . |
| 0 684 630 A2 | 11/1994 | (EP) . |
| 0 756 316 A1 | 1/1997 | (EP) . |
| 63-141342 | 6/1988 | (JP) . |
| 3-136345 | 6/1991 | (JP) . |

* cited by examiner

*Primary Examiner*—James W. Keenan
(74) *Attorney, Agent, or Firm*—Thomason, Moser & Patterson, LLP

(57) ABSTRACT

The present invention provides an apparatus and method for sequential deposition of regular series of layers on consecutive substrates in a modular assembly-line like system. The apparatus and method are especially used processing large glass or metal substrates such as are employed in solar panels. The apparatus includes a load lock chamber and a processing chamber coupled to the load lock chamber. Both the load lock chamber and the processing chamber include a platen to support the substrate. Each platen includes slots therein. A substrate transfer shuttle is provided which is moveable along a shuttle path between one position in the load lock chamber and another position in the processing chamber for transferring the substrate between the load lock chamber and the processing chamber. The shuttle may be moved below the level of the platen and may be maintained in the processing chamber during processing.

7 Claims, 17 Drawing Sheets

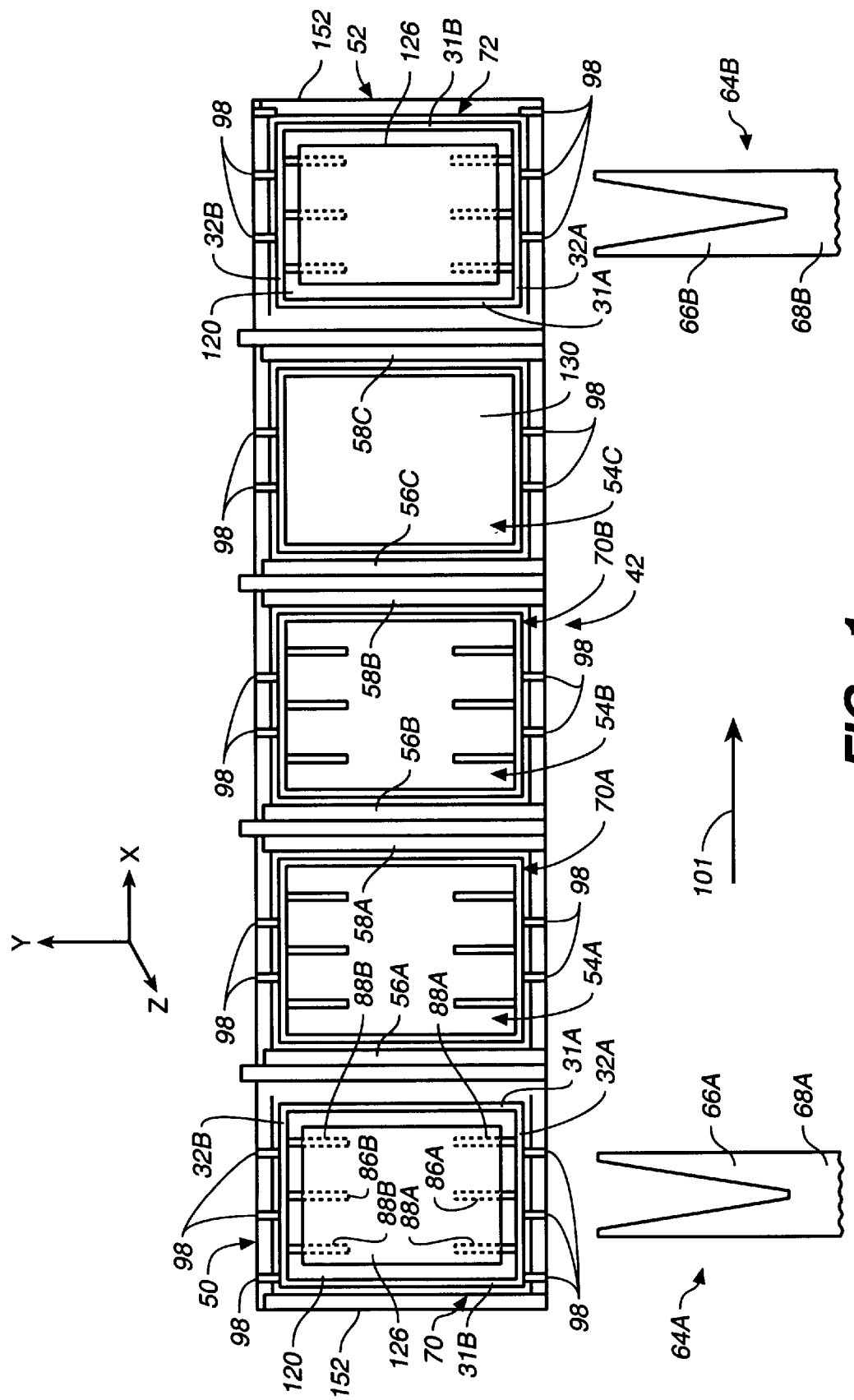
FIG._1

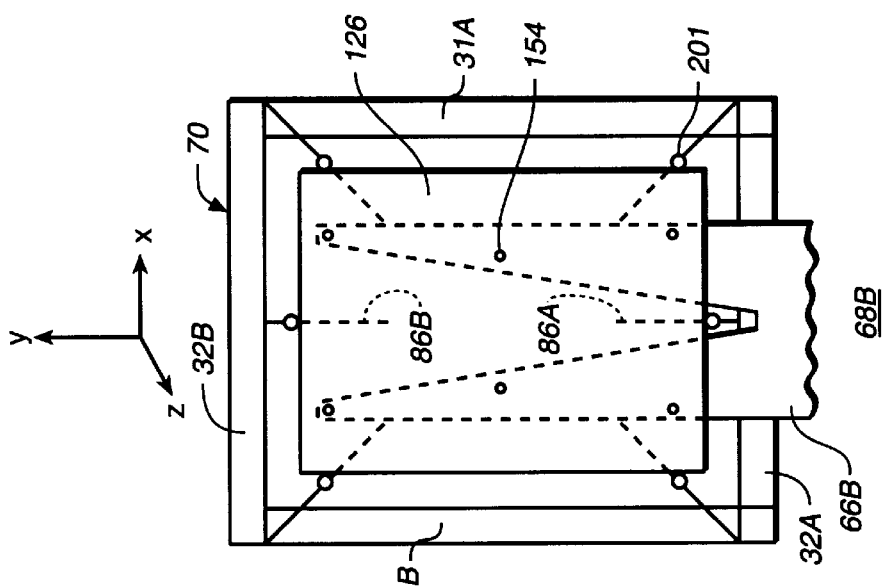
FIG._2C
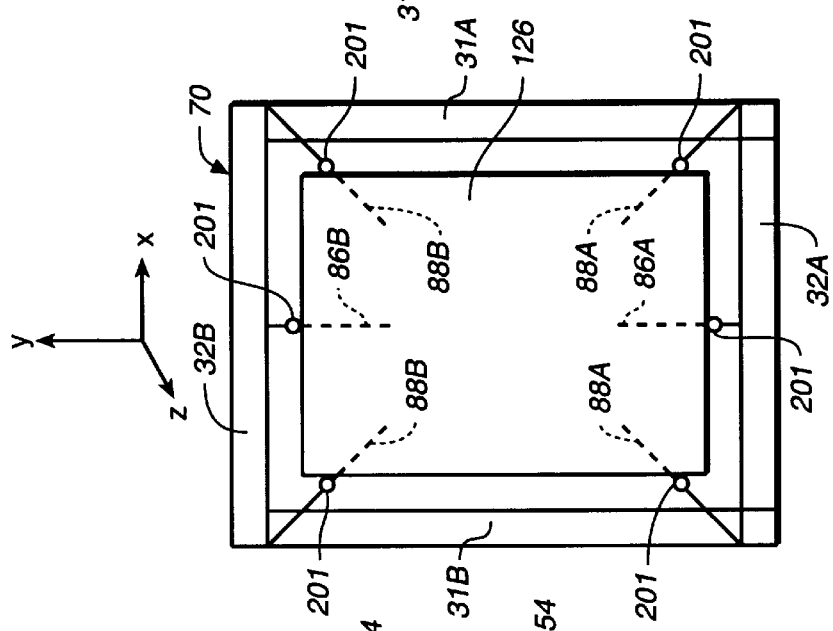
FIG._2B
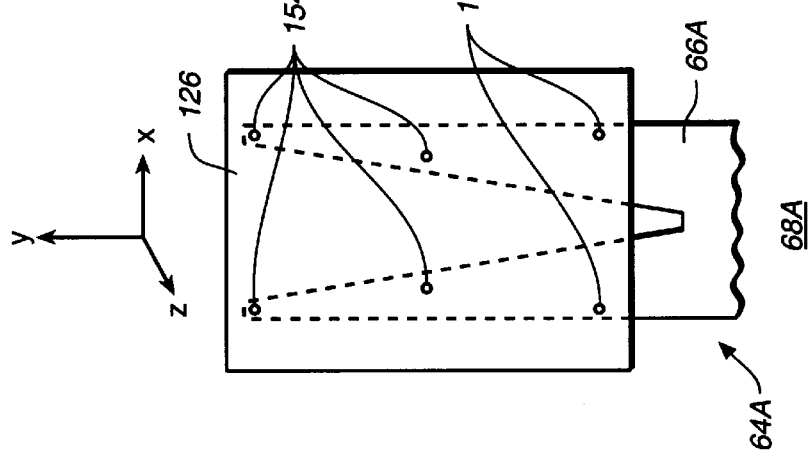
FIG._2A

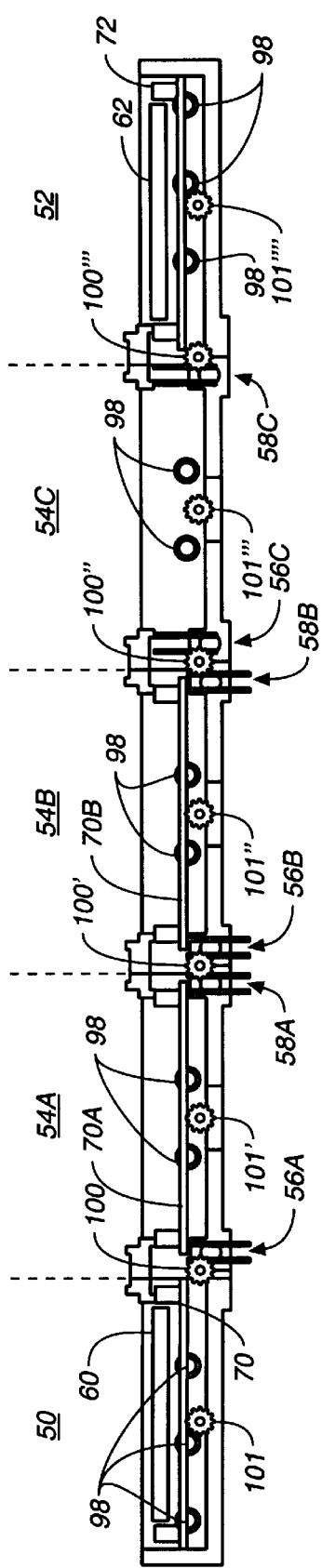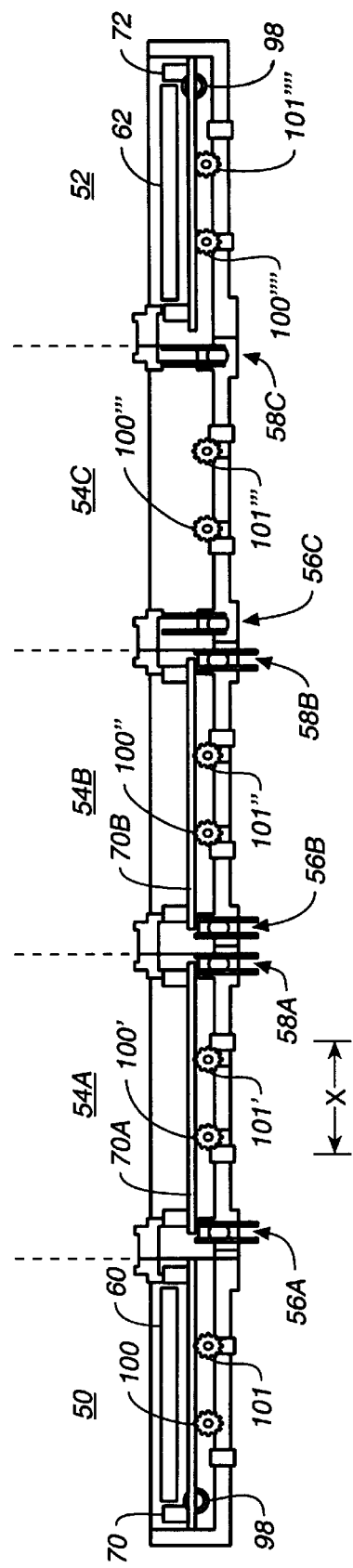
FIG._3A
FIG._3B

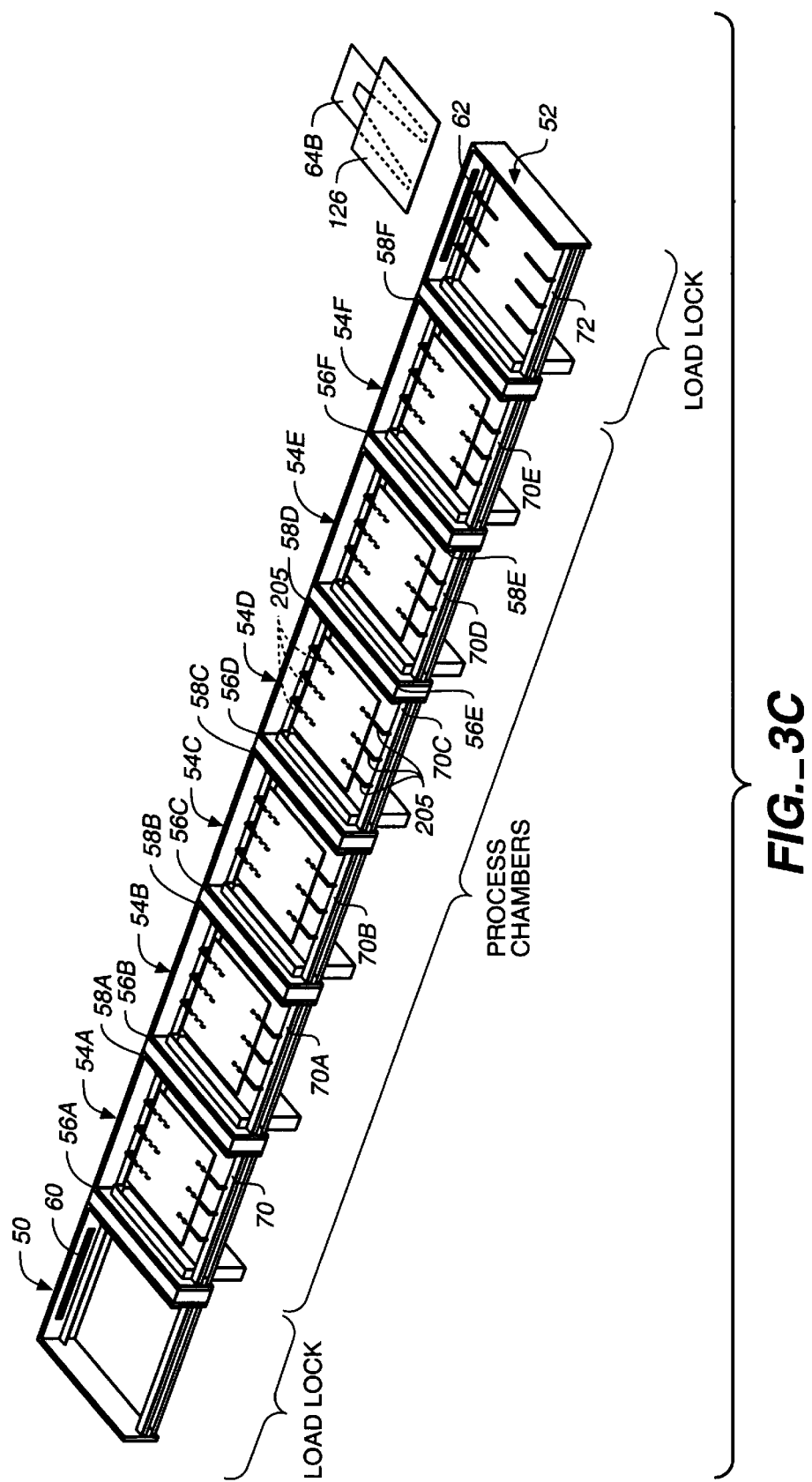
FIG._3C

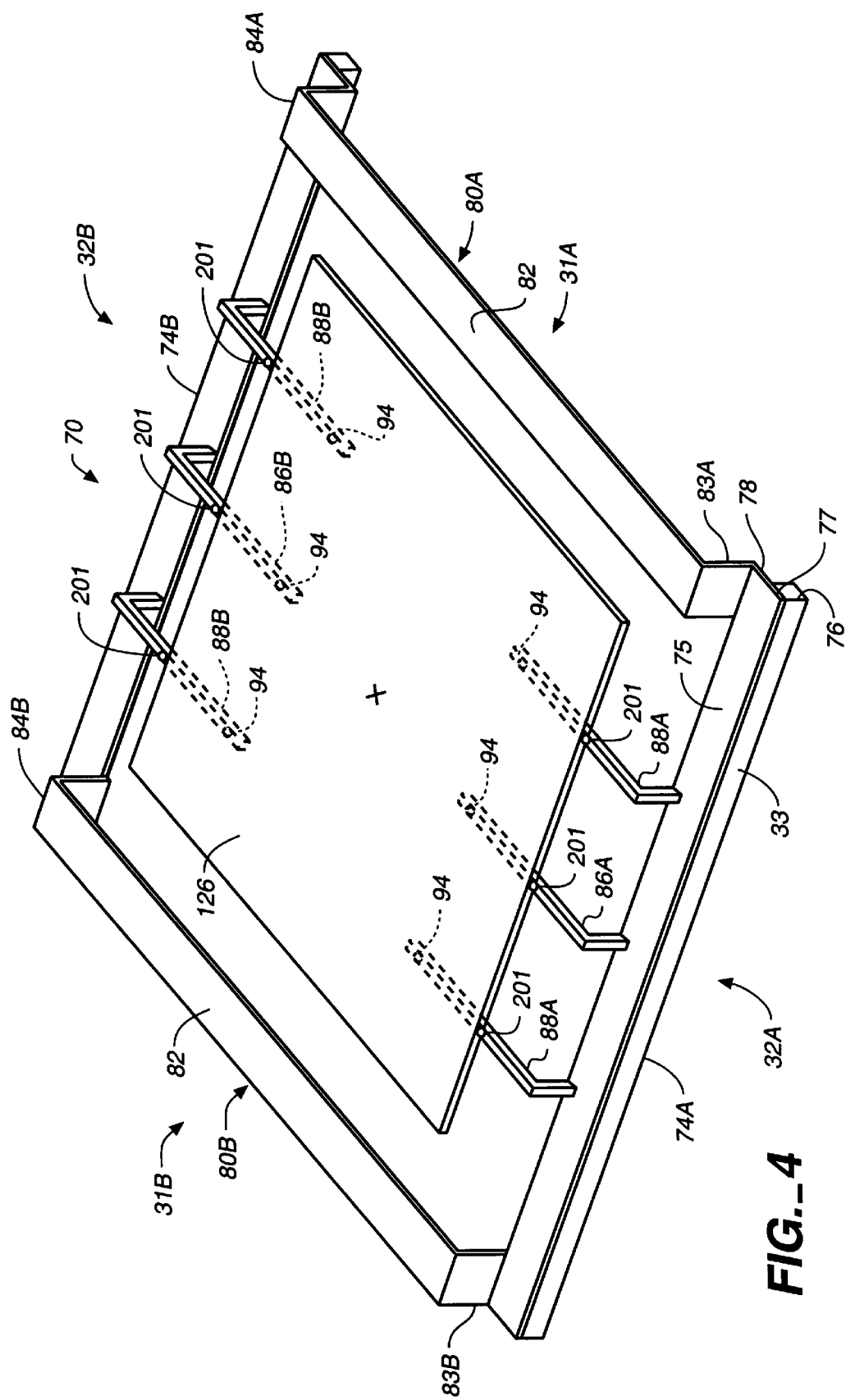

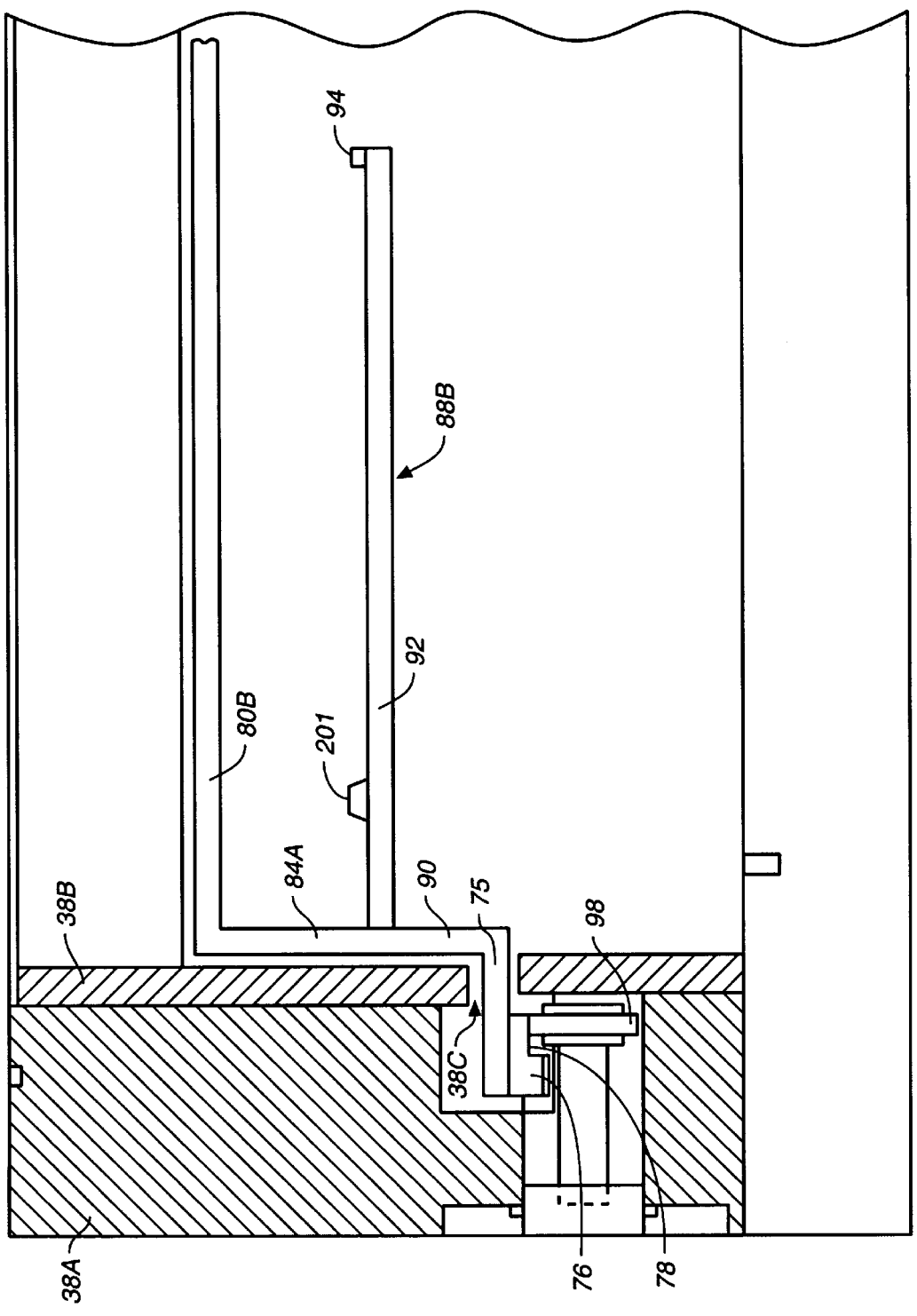
FIG._5

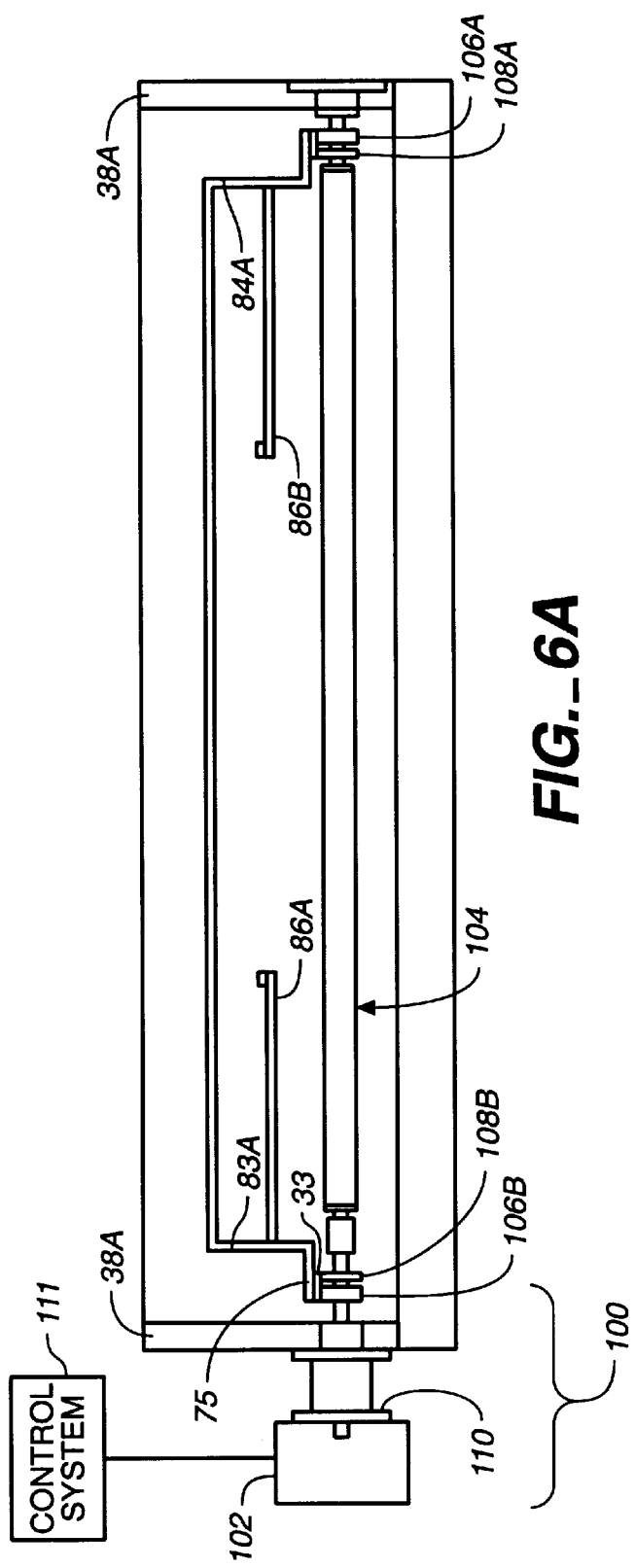
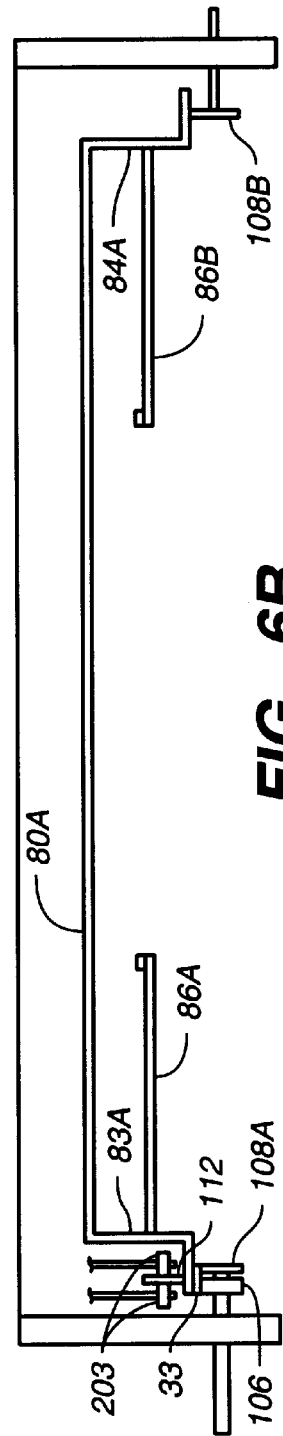
FIG._6A
FIG._6B

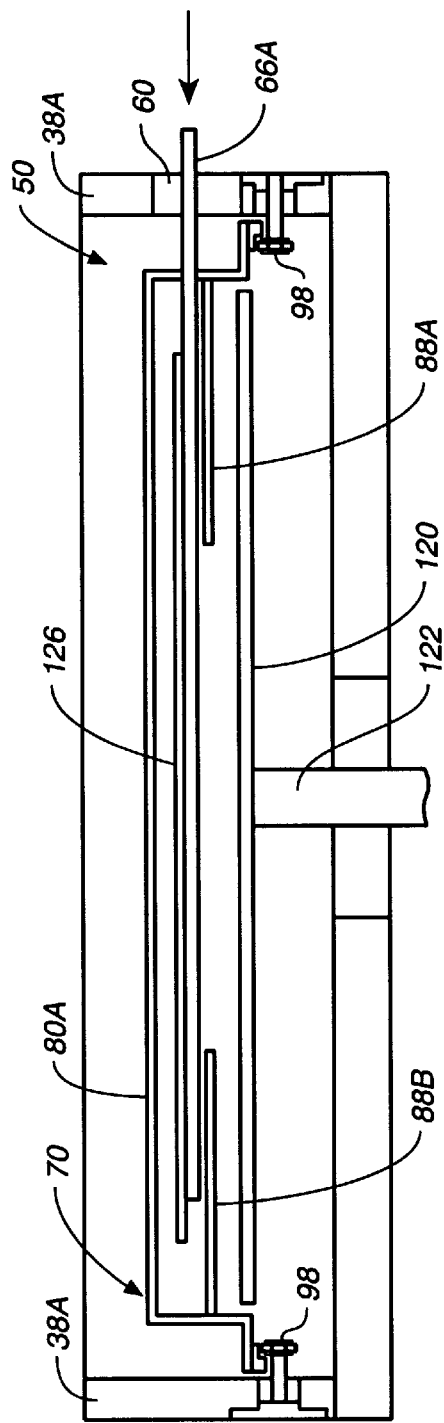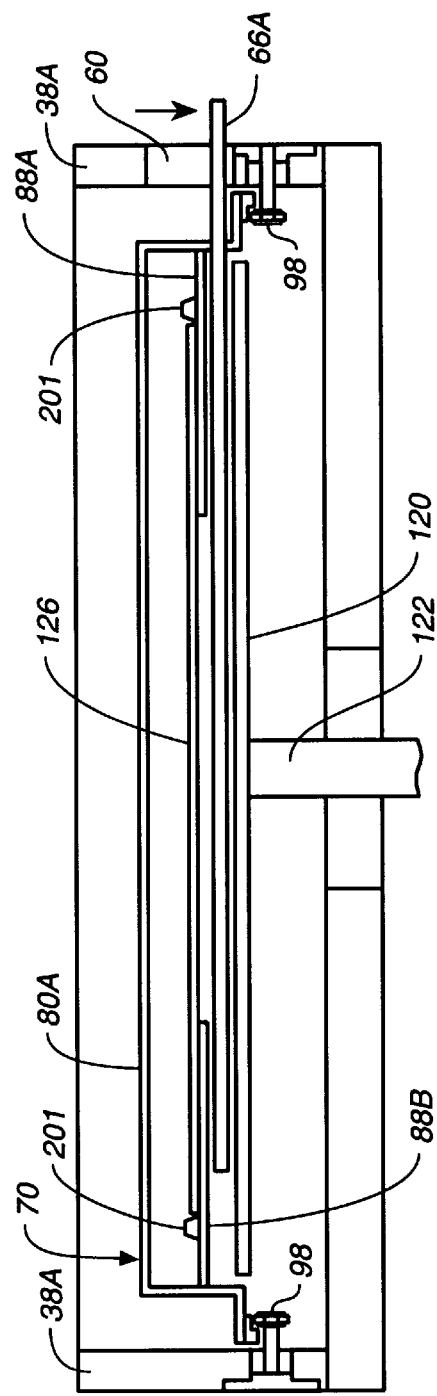

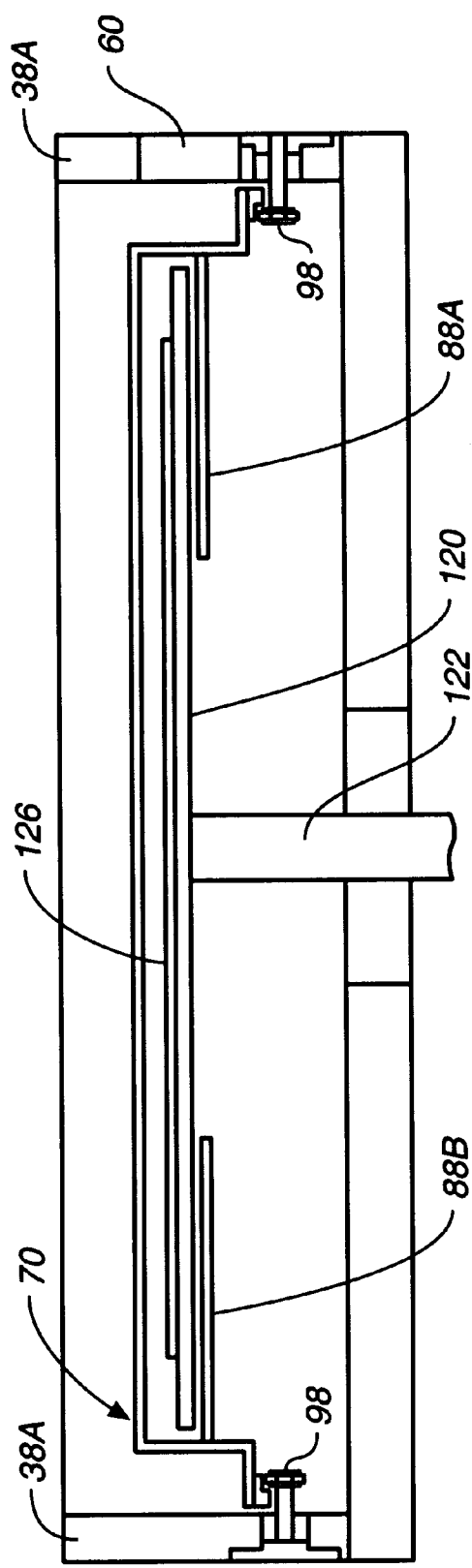

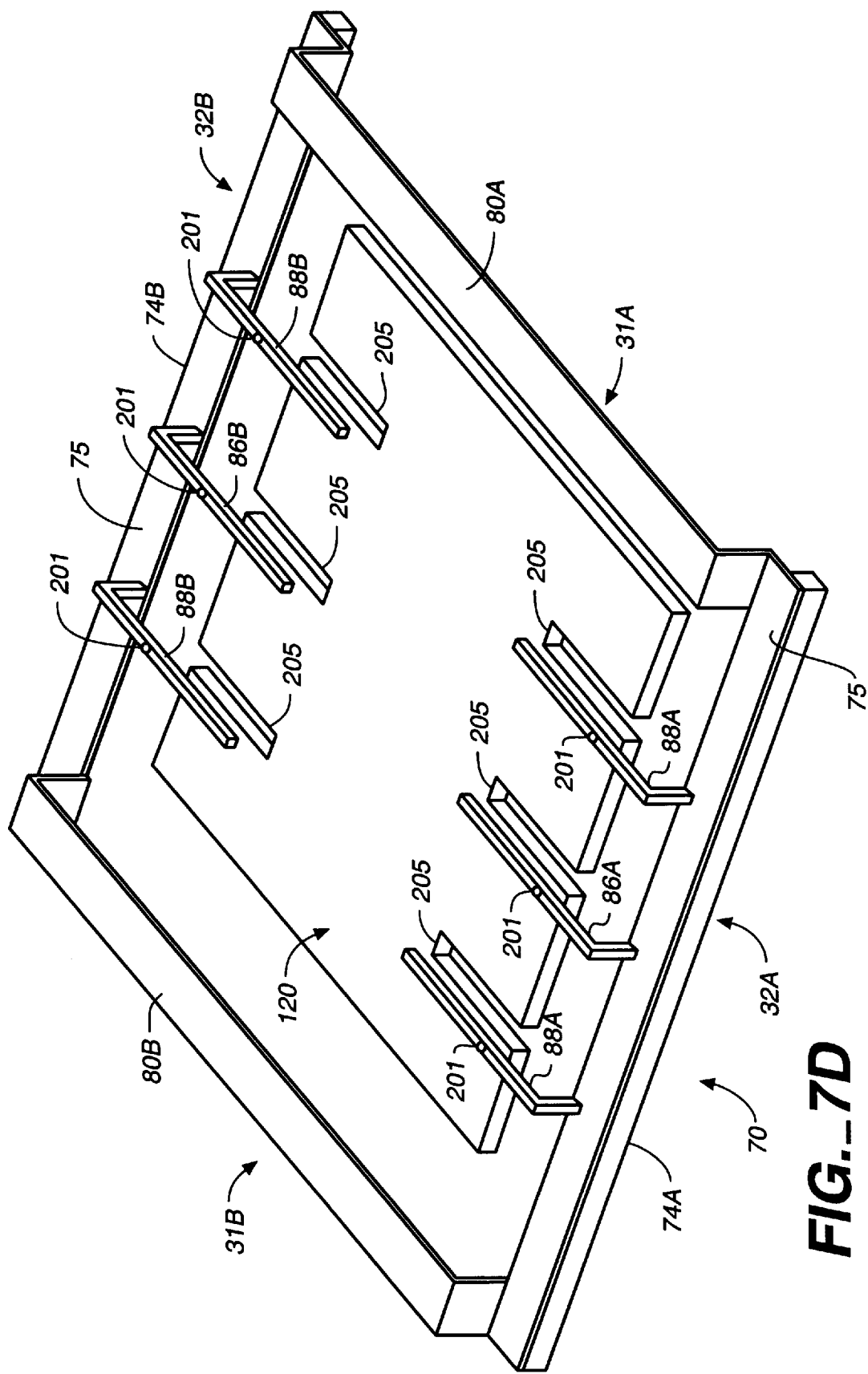
FIG._7D

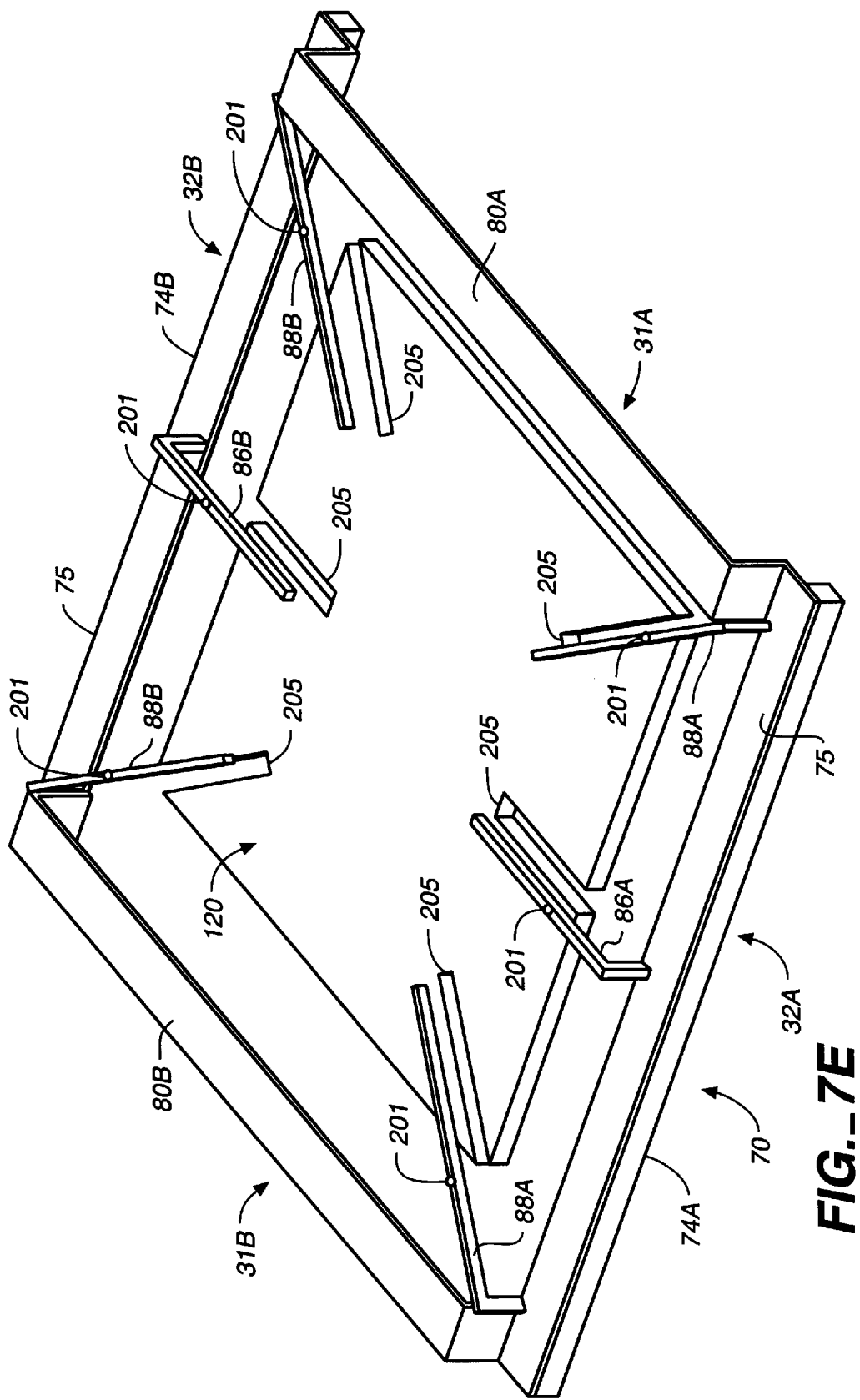
FIG._7E

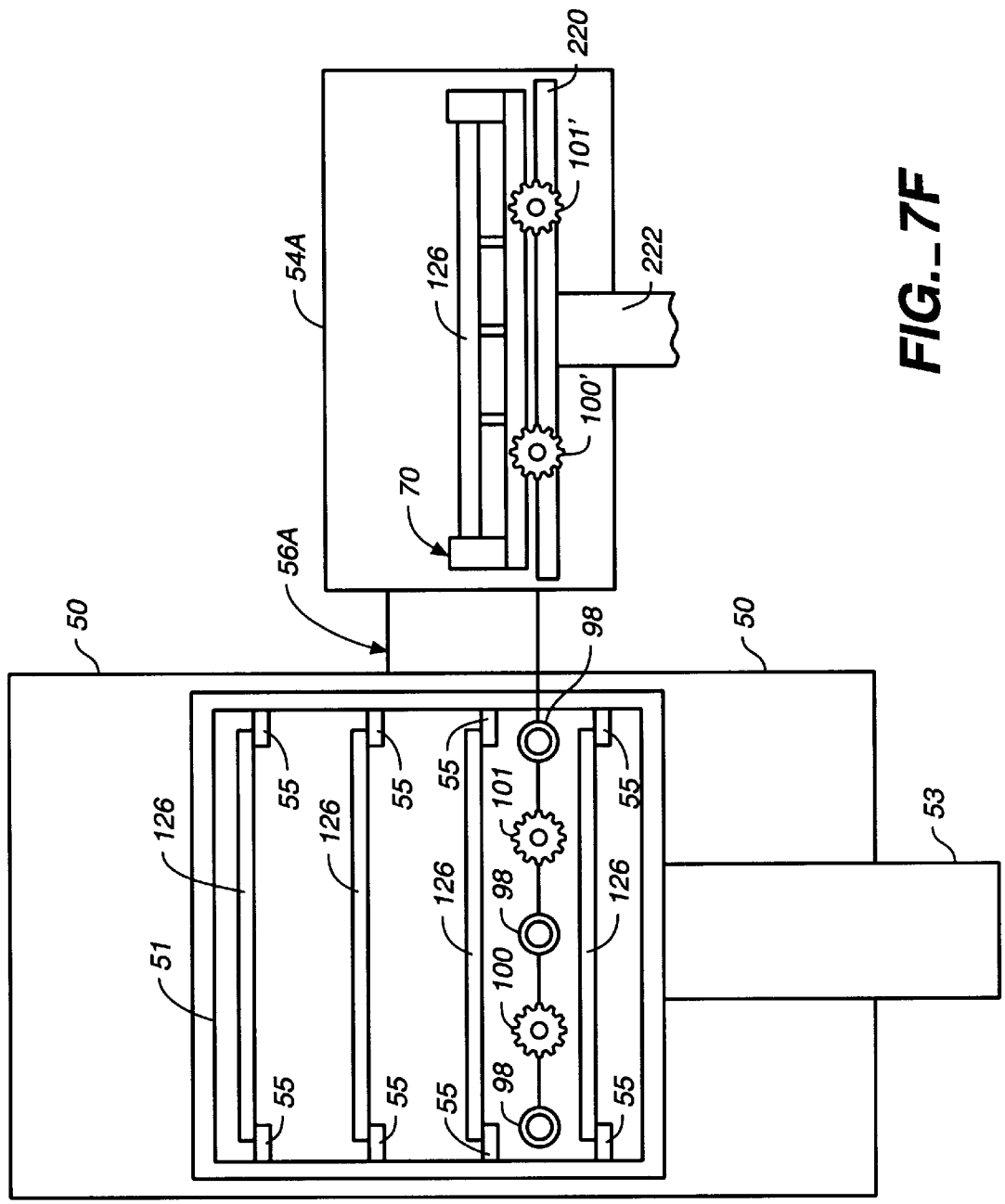
FIG._7F

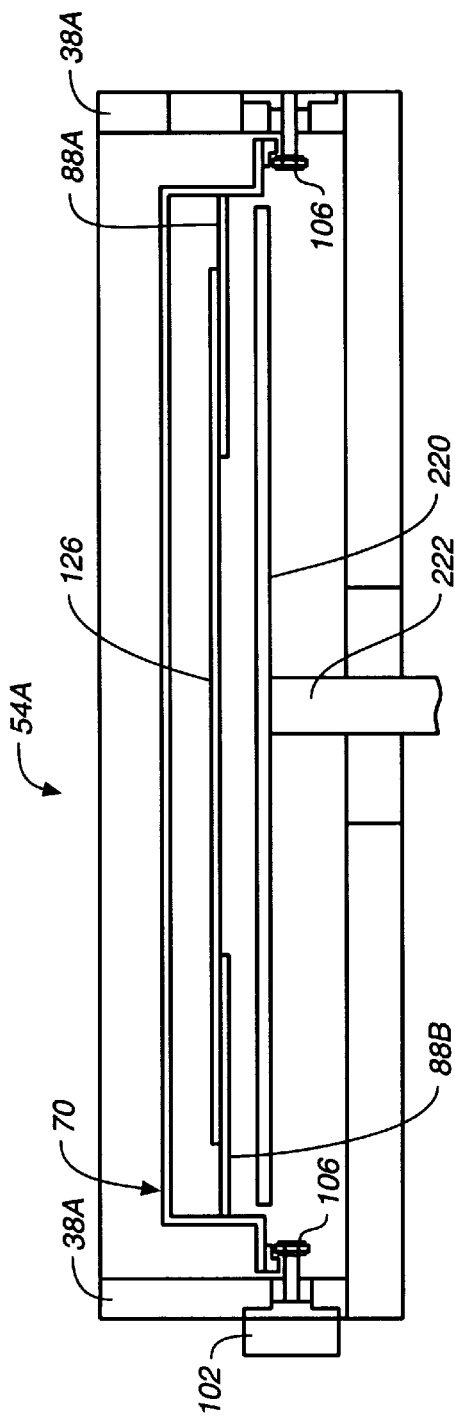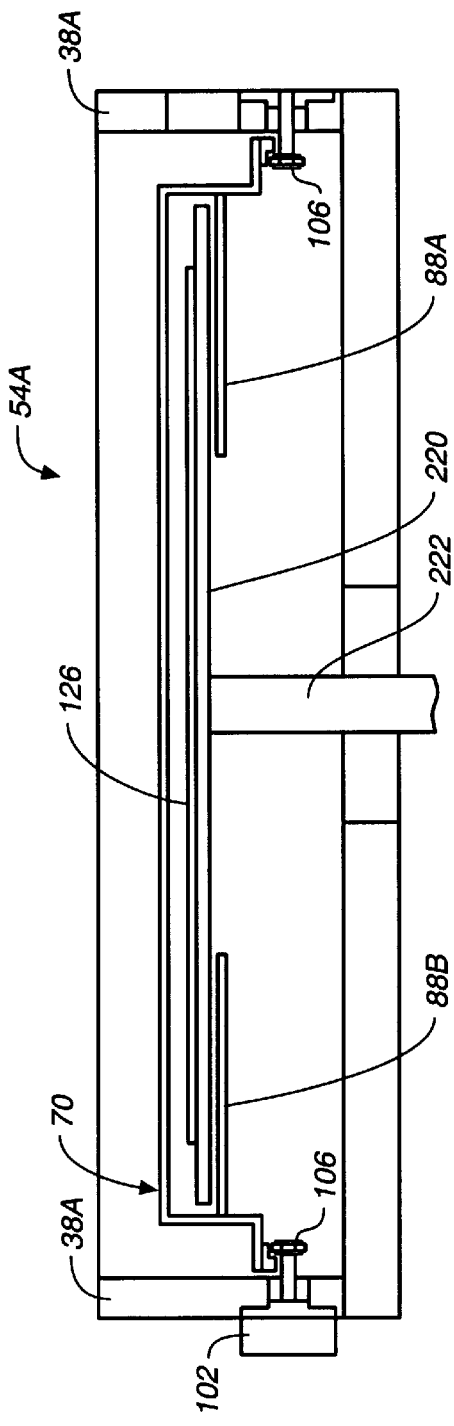

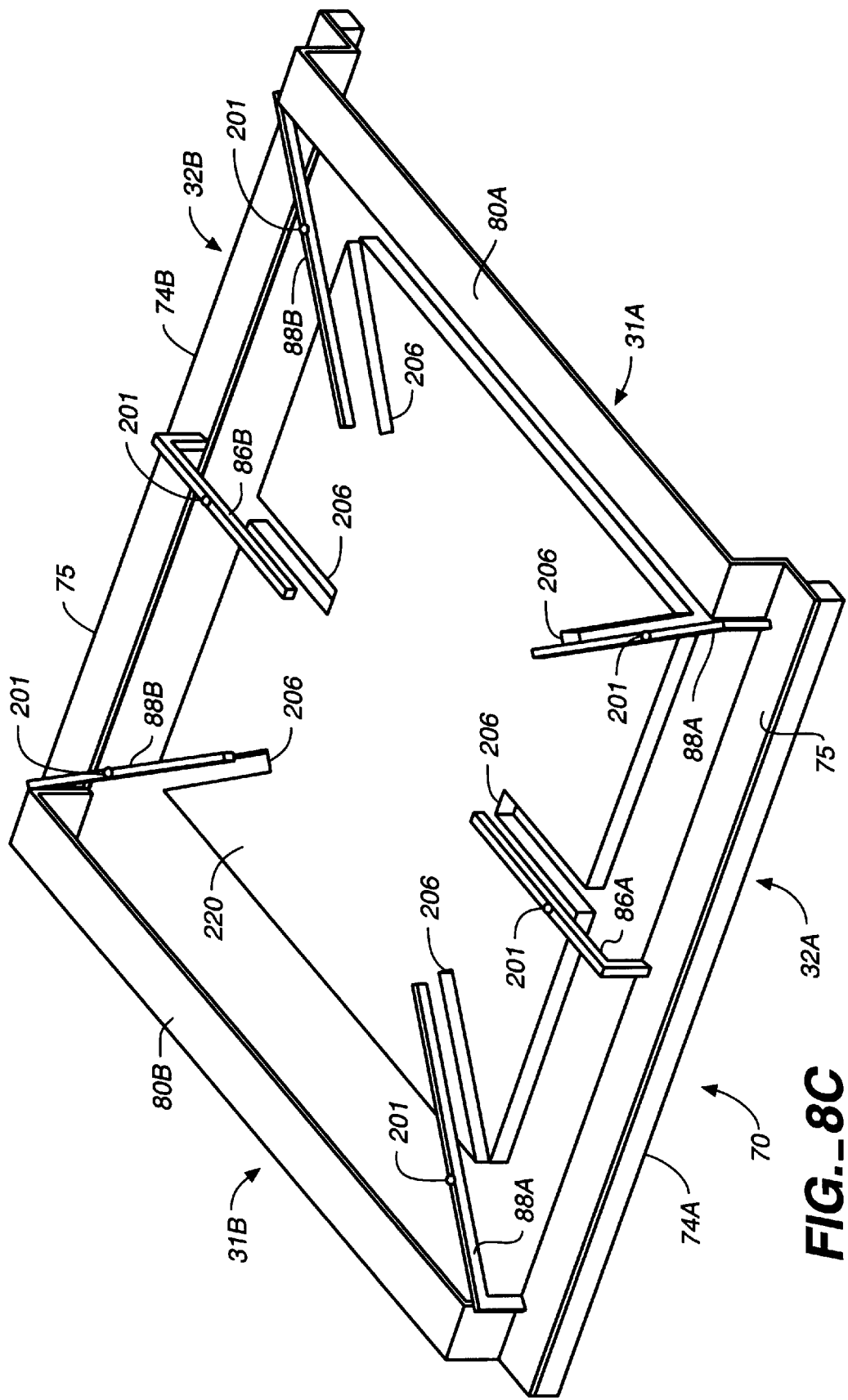

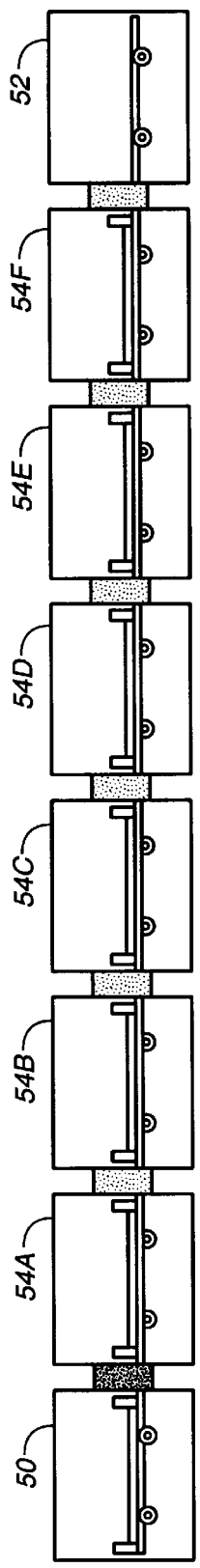
FIG._9A
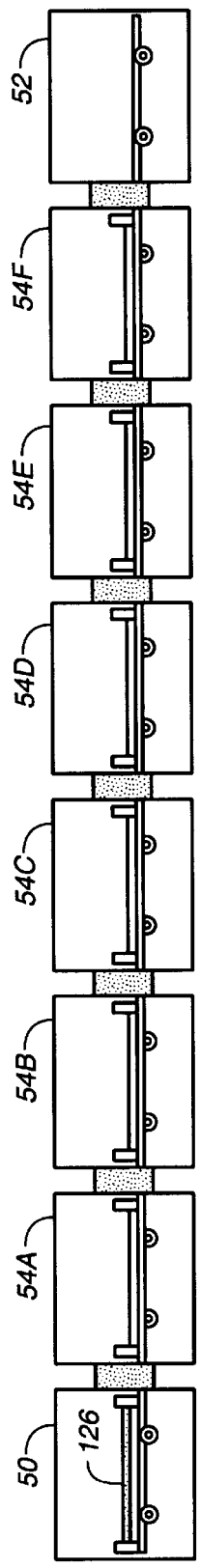
FIG._9B
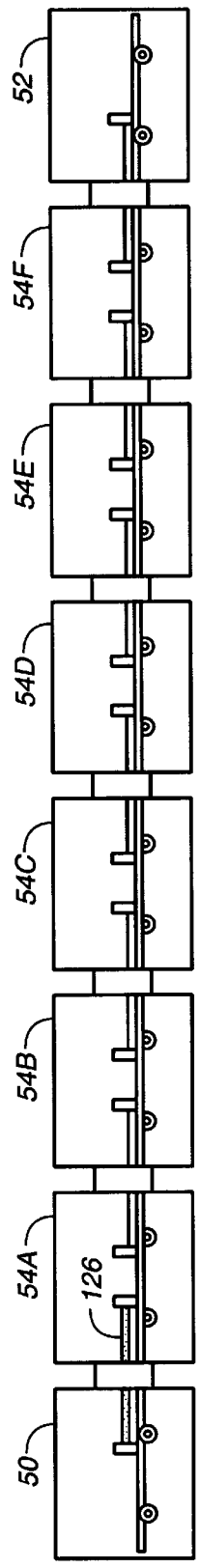
FIG._9C
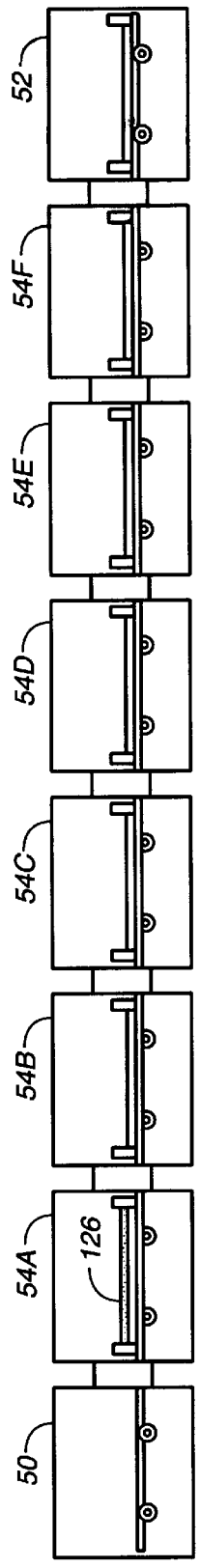
FIG._9D

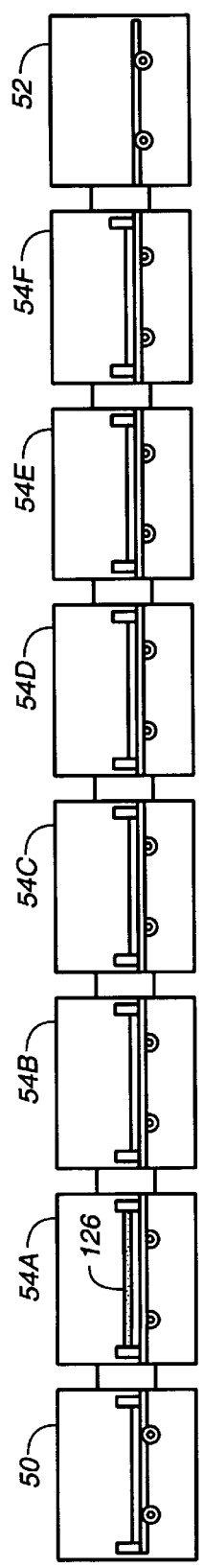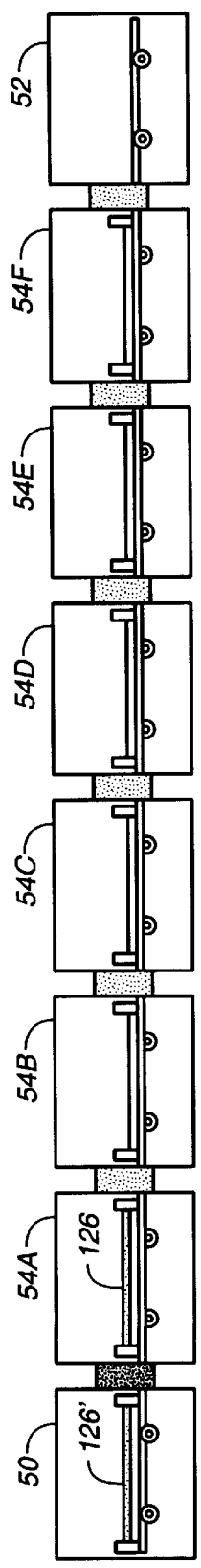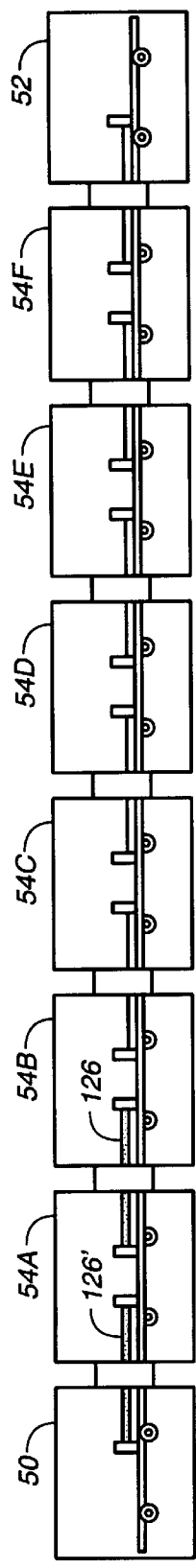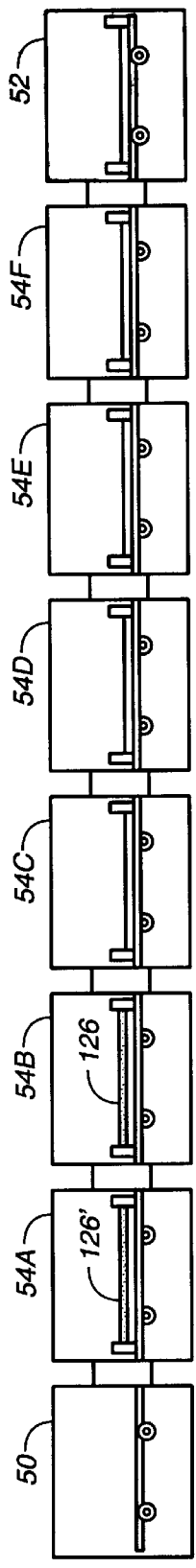
FIG._9E  FIG._9F  FIG._9G  FIG._9H

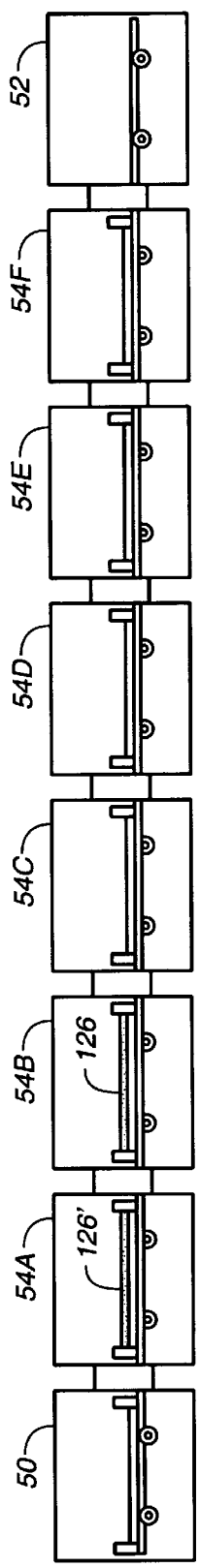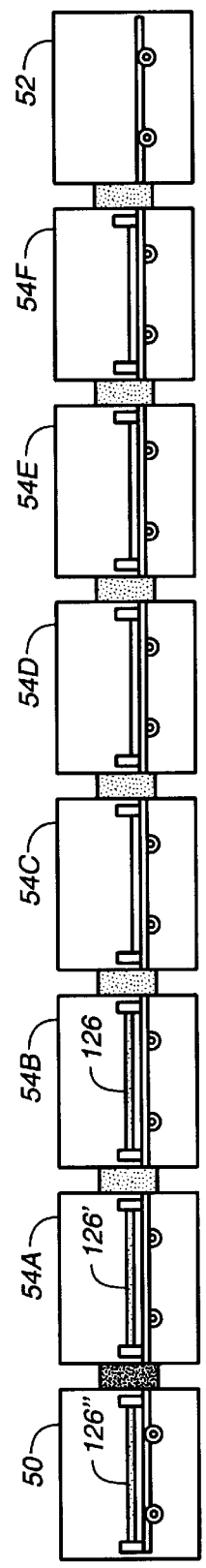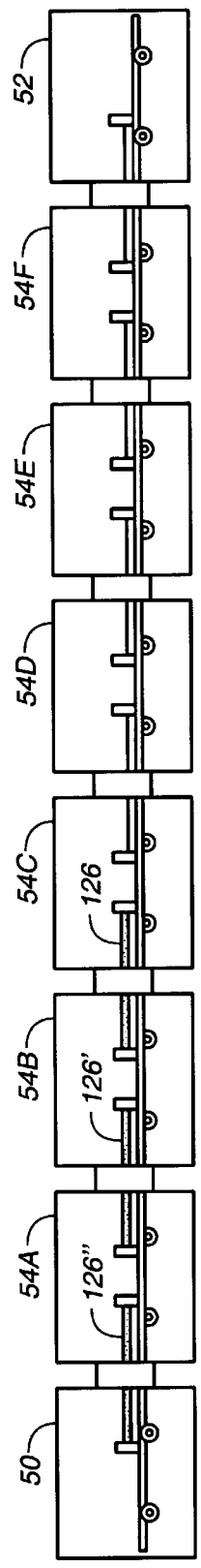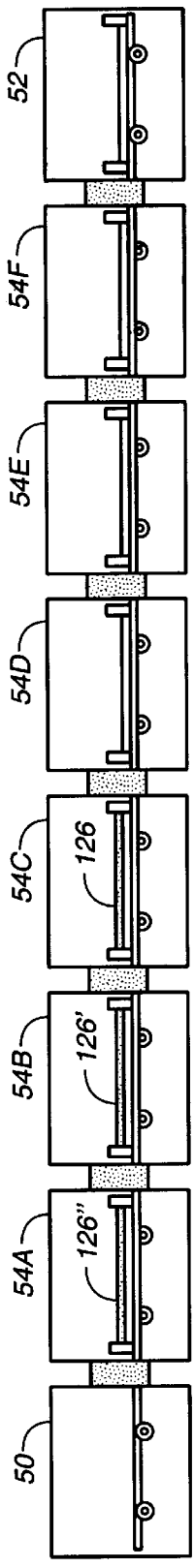

IN-SITU SUBSTRATE TRANSFER SHUTTLE

RELATED APPLICATIONS

The present application is related to co-pending U.S. patent application Ser. No. 08/946,922, entitled "MODULAR CLUSTER PROCESSING SYSTEM," filed Oct. 8, 1997. The present application is also related to the following U.S. patent applications which are being filed concurrently with this application: (1) "Method and Apparatus for Substrate Transfer and Processing" [attorney docket 2519/US/AKT (05542/235001)]; (2) "Multi-Function Chamber For A Substrate Processing System," [attorney docket 2712/US/AKT (05542/268001)]; (3) "An Automated Substrate Processing System," [attorney docket 2429/US/AKT (05542/245001)]; (4) "Substrate Transfer Shuttle Having a Magnetic Drive," [attorney docket 2638/US/AKT (05542/264001)]; (5) "Substrate Transfer Shuttle," [attorney docket 2688/US/AKT (05542/265001)]; (6) ""Modular Substrate Processing System," [attorney docket 2311/US/AKT (05542/233001)]; and (7) Isolation Valves", [attorney docket 2157/US/AKT (05542/226001)]. The foregoing patent applications, which are assigned to the assignee of the present application, are incorporated herein by reference.

BACKGROUND

The invention relates to substrate processing, and more particularly to transferring substrates to and from processing chambers where a substrate transfer shuttle may be maintained in a processing chamber during processing, such as during processing of solar panels.

Thick glass and metal substrates are being used for applications such as solar panels, among others. The thickness of such glass substrates may be, e.g., 6–9 mm. The processing of large glass and metal substrates often involves the performance of multiple sequential steps, including, for example, the performance of chemical vapor deposition (CVD) processes, physical vapor deposition (PVD) processes, or etch processes. Systems for processing such substrates can include one or more process chambers for performing those processes. For solar panels, CVD is commonly employed.

The substrates can have dimensions, for example, of 550 mm by 650 mm. The trend is toward even larger substrate sizes, such as 650 mm by 830 mm and larger. The larger sizes place even greater demands on the capabilities of the processing systems.

Some of the basic processing techniques for depositing thin films on large substrates are generally similar to those used, for example, in the processing of semiconductor wafers. Despite some of the similarities, however, a number of difficulties have been encountered in the processing of large substrates that cannot be overcome in a practical way and cost effectively by using techniques currently employed for semiconductor wafers and smaller glass substrates.

For example, efficient production line processing requires rapid movement of the substrates from one work station to another, and between vacuum environments and atmospheric environments. The large size and shape of the substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger substrates, such as 650 mm by 830 mm and above. Moreover, cluster tools require a relatively large floor space.

Similarly, chamber configurations designed for the processing of relatively small semiconductor wafers are not particularly suited for the processing of these larger substrates. The chambers must include apertures of sufficient size to permit the large substrates to enter or exit the chamber. Moreover, processing substrates in the process chambers typically must be performed in a vacuum or under low pressure. Movement of substrates between processing chambers, thus, requires the use of valve mechanisms which are capable of closing the especially wide apertures to provide vacuum-tight seals and which also must minimize contamination.

Reducing the occurrence of defects in the substrate when it is transferred from one position to another is important. Similarly, misalignment of the substrate as it is transferred and positioned within the processing system can cause the process uniformity to be compromised to the extent that one edge of the substrate is electrically non-functional. If the misalignment is severe enough, it even may cause the substrate to strike structures and break inside the vacuum chamber.

Other problems associated with the processing of large substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the substrate combined with its size, therefore, makes it more difficult to obtain uniform characteristics for the electronic components formed on different portions of the surface of a processed substrate. Moreover, heating or cooling glass substrates quickly and uniformly is more difficult as a consequence of its poor thermal conductivity, thereby reducing the ability of the system to achieve a high throughput.

In the case of solar panels, typical substrates are rigid panels of glass or a metal such as steel or aluminum. For front surface panels, metal is used. In this case, thermal losses are less significant. For back surface panels, either glass may be used. If the panels are glass, thicknesses of between 6 and 9 mm are often used. These types of substrates, for example, generally do not bow under the temperatures encountered in solar panel formation (e.g., about 300° C.–400° C.).

In certain types of solar panels, the active film is a PIN/PIN type or an NIP/NIP type, where the individual layers are made of doped or intrinsic amorphous silicon. In other words, a regular series of layers must be deposited on each substrate to form a solar panel. One drawback to current systems is that they generally do not allow for the sequential deposition of regular series of layers on consecutive substrates in a modular assembly-line like system.

SUMMARY

The present invention allows sequential deposition of a regular series of layers on consecutive substrates in a modular assembly-line like system. The invention provides an apparatus for processing a substrate such as a solar panel. The apparatus includes a load lock chamber and a processing chamber coupled to the load lock chamber. Both the load lock chamber and the processing chamber include a platen to support the substrate. Each platen includes slots therein. A valve selectively seals the load lock chamber from the processing chamber when closed and permits transfer of the substrate between the load lock chamber and the processing chamber when open.

A substrate transfer shuttle is provided which is moveable along a shuttle path between one position in the load lock chamber and another position in the processing chamber for transferring the substrate between the load lock chamber and the processing chamber. The substrate transfer shuttle includes a plurality of substrate supports to support the substrate during transfer of the substrate from the load lock chamber to the processing chamber. The substrate supports are structured so as to pass through the slots in the platen as the platen is moved in a vertical direction between a first position and a second position. The substrate transfer shuttle may be kept in the processing chamber during performance of the process.

In many solar panel processes, six such processing chambers may be employed to deposit sequential layers on the substrate. The modularity of the system according to the present invention allows such groups of processing chambers to be arbitrarily coupled together according to the demands of a particular process. In this case, a plurality of substrate transfer shuttles are provided, each movable between adjacent ones of the process chambers in the array, or between a process chamber and a load lock chamber.

At least one drive mechanism, and preferably two, is located within each chamber and is engageable with the substrate transfer shuttle to move the same along a shuttle path.

The method of processing substrates in a multiple process chamber array includes steps of loading a plurality of substrates into an array of process chambers and processing at least some of the substrates within the array of process chambers. During the processing step, an additional substrate is loaded into an entrance load lock chamber. Each of the substrates is then transferred into an adjacent processing chamber or a load lock.

Advantages of the invention include one or more of the following. The invention eliminates unnecessary substrate movement in a semiconductor processing system. For example, the substrate may be transferred horizontally except for loading and unloading on the platen. The invention eliminates more expensive and cumbersome vacuum robots and transfer chamber systems. The invention allows storage of the shuttle beneath a platen during processing. With the shuttle resident in the processing chamber during processing, shuttle movement is reduced, decreasing processing time. Further, when the shuttle is resident in the processing chamber, formation of assemblies of devices such as solar panels on large glass or metal substrates may be effectively performed.

DESCRIPTION OF DRAWINGS

FIG. 1 is a top plan schematic view of a processing island of a system according to the present invention.

FIGS. 2A–2C are top plan schematic views of a shuttle and lifting fork according to the present invention.

FIG. 3A is a side schematic view of a processing island of a system according to an embodiment of the present invention.

FIG. 3B is a side schematic view of an alternate embodiment of a processing island according to the present invention.

FIG. 3C shows a processing island including six process chambers according to an embodiment of the present invention.

FIG. 4 is a perspective view of a substrate transfer shuttle according to the present invention.

FIG. 5 is a partial cross-sectional view of a processing chamber and substrate transfer shuttle according to the present invention.

FIG. 6A is a transverse cross-sectional view of a processing island and shuttle according to an embodiment of the present invention.

FIG. 6B is a transverse cross-sectional view of a processing island and shuttle according to an alternative embodiment of the present invention.

FIGS. 7A–7C are partial schematic cross-sectional views of a load lock chamber according to the present invention, showing a substrate in various stages of transfer from without to within the load lock chamber.

FIGS. 7D–7E are perspective views of alternative embodiments of a substrate transfer shuttle and a platen as support fingers of the shuttle pass through the platen.

FIG. 7F shows an embodiment of the invention using a multiple substrate cassette.

FIGS. 8A–8B are partial schematic cross-sectional views of a processing chamber according to the present invention, showing a substrate in various stages of transfer.

FIG. 8C is a perspective view of a shuttle and process chamber platen as support fingers of the shuttle pass through the platen.

FIGS. 9A–9L show side schematic views of movements of substrates and shuttles within the six-chamber array of FIG. 3C.

Like reference numbers and designations in the various drawings indicate like elements.

DETAILED DESCRIPTION

FIG. 1 shows a processing island 42 of a fabrication system according to an embodiment of the present invention. Arrow 101 defines a direction pointing from "upstream" to "downstream" in the processing island. As mentioned above, many solar panel fabrication processes employ a six-layer sequential deposition for the construction of layers such as PIN/PIN or NIP/NIP, where the individual layers are made of doped or intrinsic amorphous silicon. Thus, six process chambers may be conveniently employed to deposit such films. Each process chamber may perform a different process, and the substrates may simply be shuttled from one to the next. Alternatively, each process chamber may be loaded with a substrate, and then each process chamber may deposit each of the six layers sequentially. Other techniques may also be used. However, for convenience of description of the basic process, three processing chambers 54A–54C are shown. A six chamber system is described in more detail below in connection with FIGS. 3C and 9A–9L.

The island 42 includes a substrate heating load lock chamber 50 at a first end of the island and a substrate cooling load lock chamber 52 at a second end of the island, longitudinally opposite and downstream of the first end. Of course, the terms "heating" and "cooling" are not intended to be limiting. Rather, they are descriptive of exemplary features such chambers may possess.

Between the load lock chambers 50 and 52 are a plurality of processing chambers 54A–54C, which are connected in series between the load lock chambers. Each processing chamber 54A–54C includes first and second gate valves 56A–56C and 58A–58C, respectively, at the first and second ends of each processing chamber (see also FIGS. 3A and 3B). The valve 56A selectively seals the load lock chamber 50 from the processing chamber 54A when closed and permits transfer of substrates through the valve 56A when open. Similarly, the valve 58C selectively seals the load lock chamber 52 from the processing chamber 54C in a closed condition and permits the transfer of substrates through the valve in an open condition. The valves 58A and 56B seal the first processing chamber 54A from the second processing chamber 54B when closed and permit the transfer of substrates through the valves when open. Likewise, the valves 58B and 56C selectively seal the second processing chamber 54B from the third processing chamber 54C when closed and permit the transfer of substrates through the valves when open. The pairs of valves, 58A, 56B and 58B, 56C may be replaced with single valves although the illustrated configuration has advantages described below. An example of the type of valve which may be employed is described in above-mentioned U.S. patent application entitled "Isolation Valves", [attorney docket number 2157 (226001)] filed on even date herewith, and incorporated by reference above.

This detailed description describes an embodiment in which a large metal or glass substrate is used. The term "substrate" is intended to broadly cover any object that is being processed in a process chamber, especially solar panels or other such devices. The present invention is particularly applicable to large substrates such as thick glass or metal plates having dimensions of 650 mm by 830 mm or even larger. The thickness of the glass used may be, e.g., as thick as about 6 mm to about 9 mm.

In this system, the substrate is supported by support fingers. The support fingers may all be parallel, as shown in the embodiment of FIGS. 1, 3C, 4, and 7D, or some may be angled as shown in the embodiment of FIGS. 2B–2C, 7E and 8C. In the described embodiments, the short dimension of the substrate is generally parallel to the direction of movement within a processing island.

FIGS. 1 and 3A–3B show substrate transfer shuttles 70 and 72 of the load locks 50 and 52, respectively, as well as shuttles 70A and 70B in process chamber 54A and 54B, respectively. In FIGS. 3A–3B, valves 56A, 58A, 56B and 58B are shown open, and valves 56C and 58C are shown closed. As shown in FIGS. 3A–3B, the load lock chambers 50 and 52 have respective gate or slit valves 60 and 62 positioned along one side of the island. The valves 60 and 62 selectively seal their associated load lock chambers from atmosphere when closed and allow introduction or removal of substrates to or from the load lock chambers when open. The substrates may be introduced through the valve 60 to the load lock chamber 50 which forms an entrance load lock chamber. With the load lock chamber 50 in a condition sealed from the atmosphere and process chamber 54A, the load lock chamber may be pumped to vacuum and the substrate heated.

The load lock system allows a staged vacuum to occur. That is, the process chamber vacuum need not be breached for substrates to be loaded and unloaded. Since the load locks 50 and 52 are independently pumped-down prior to the opening of the valves separating them from the process chambers, the process chamber pumps need only evacuate a chamber that is already partially at vacuum. That is, they need only maintain process vacuum conditions, not develop them. Such a capability is particularly important for, e.g., physical vapor deposition (PVD), which may often require the lowest pressure of any process. Typically, however, for solar panels, primarily CVD is employed.

Each load lock chamber may be multifunctional. Process steps such as heating, cooling, and descumming may be provided for in each load lock. Heating and cooling may be provided for by heating and cooling platens which may be moved into and out of thermal contact with the substrate. Typically, the load lock 50 may be used to heat and descum, while the load lock 52 may be used to cool. Ashing processes may also be provided for in the chambers. The substrate is then passed among the processing chambers 54A–54C. In each processing chamber, a specific semiconductor process may be performed on the substrate. Ashing or descumming may also occur in a processing chamber. More details of a multifunctional load lock may be found in above-mentioned U.S. patent application entitled "Multi-Function Chamber for a Substrate Processing System," [attorney docket number 2712 (268001)] filed on even date herewith, and incorporated by reference above.

A processed substrate may be cooled in the cooling load lock chamber 52, which forms an exit load lock chamber, and may also be brought up to atmospheric pressure. Thereafter, the substrate may be removed from the system through the valve 62. Introduction and removal of substrates to and from the load lock chambers 50 and 52 may be performed by robots 64A and 64B, respectively (see FIG. 1). Alternatively, just one robot may be employed, operating on a track or conveyor, to introduce or remove substrates.

Each robot includes an end effector in the form of a lifting fork 66A, 66B at the distal end of an arm 68A, 68B. At its proximal end, each arm 68A, 68B is coupled to an associated vertical linear actuator (not shown) to permit the arm and lifting fork to be raised and lowered. Referring to FIGS. 2A and 2C, the top of the lifting forks 66A and 66B may have thereon a number of supports 154 to support a substrate 126 on top of the forks 66A, 66B.

The robot 64A, for instance, can retrieve and return substrates to and from substrate holding cassettes. In a first loading position, the robot 64A may load a substrate into load lock chamber 50 of the island through the gate or slit valve 60 (FIGS. 3A–3C). Note that the orientation of the process chambers and load locks in FIG. 3C is opposite that shown in FIGS. 3A and 3B. In FIG. 3C, from the perspective of one looking at the island from the side with the slit or gate valves 60 and 62, substrates are loaded into the rightmost chamber and removed from the leftmost. In FIGS. 3A–3B, from the perspective of one looking at the island from the side with the slit or gate valves 60 and 62, substrates are loaded into the leftmost chamber and removed from the rightmost. Robot 64B operates in a similar fashion to robot 64A. More details of the robots may be found in U.S. patent application entitled "Modular Substrate Processing System," filed on even date herewith, and incorporated by reference above. In a first or lowered position, the fork 66A may be inserted beneath a substrate in a cassette or on a shuttle in a load lock chamber. The fork design is such that the same fork may be used for either, facilitating considerable advantage in incorporating the system into existing product lines.

When raised to an intermediate position, the upper surface of the fork 66A or, more particularly, supports or pads 154 (see FIGS. 2A and 2C) along the upper surface of the fork tines, engage the lower surface of the substrate 126. When further elevated to a second or raised position, the fork 66A lifts the substrate out of engagement with the cassette or shuttle.

During loading, a z-rotary actuator of the robot 64A is caused to rotate the loading end effector 66A 180° so that the substrate 126 may be introduced into load lock heating chamber 50 through the slit valve 60. Fine adjustments may be made by the z-linear actuator to adjust the height of the substrate 126 so that the substrate 126 may enter through the slit valve 60 (FIGS. 3A–3C) unimpeded. During substrate loading, the slit valve 60 is opened and the substrate is moved by a y-linear actuator in the y-direction. This movement loads the substrate into load lock chamber 50 where it is lowered onto the shuttle 70 using the z-linear actuator. The empty end effector 66A may then be withdrawn from the chamber 50. Slit valve 60 is then closed and the heating and evacuation process begun.

The extraction of the substrate from the cooling load lock chamber 52 by the robot end effector 68B may be performed by substantially reversing the steps used with the robot end effector 66A to introduce the substrate to the heating load lock chamber 50.

The first shuttle 70 is positioned in the heating load lock chamber during introduction of a substrate to the heating load lock chamber 50. The second shuttle 72 is positioned in the cooling load lock chamber 52 during extraction of a substrate from the cooling load lock chamber 52. Other shuttles are distributed amongst the process chambers according to the process parameters. The shuttles may be made of stainless steel, invar, ceramics or any other similar material. Invar may be preferable as it has a low coefficient of thermal expansion.

The load lock chambers 50 and 52 may be equipped with maintenance windows or slits 152 (FIG. 1). These windows 152 allow the removal of the components from the load locks for maintenance or repair. During such a maintenance situation, both shuttle and chamber components may be repaired.

Each shuttle has a first end 31A facing from the associated load lock chamber toward the adjacent processing chamber and a second end 31B opposite the first end. Each shuttle further has first 32A and second 32B sides. The shuttles may be the same or mirror images of each other and are positioned facing each other.

Referring to FIGS. 2A–2C, 4, and 7D–7E, each shuttle includes first and second side rails 74A and 74B along the respective first and second sides of the shuttle. Both side rails 74A and 74B extend substantially between the first and second ends of the shuttle. The side rails are parallel to and spaced-apart from each other. Each side rail includes a generally flat horizontal strip 75. Along an outboard portion of the underside of each strip 75, the rail bears a rack 76. An outboard portion 77 of the underside of each rack bears angled teeth 33 (the shape of the teeth is not shown). An inboard portion 78 of the underside of each rack is flat for engaging a number of guide rollers as described below.

First and second cross-members 80A and 80B, respectively, proximate the first and second ends 31A 31B of the shuttle, structurally connect the first and second side rails 74A and 74B to each other. Each cross-member includes a flat central horizontally-extending strip 82. First (83A and 84A) and second (83B and 84B) legs depend from first and second ends of the strip and connect such ends to the first and second side rails, respectively.

An "X" indicates the location of the center of the substrate. This X location should roughly correspond with the center of the processing chamber, as measured in a horizontal plane, for optimum processing of the substrate.

Substrate support fingers 86A, 88A, 86B and 88B extend inwardly from the associated first and second side rails, respectively. Referring to FIGS. 4–5, each support finger has a proximal portion 90 extending upwardly from the associated side rail 75 and a distal portion 92 extending horizontally inwardly from the proximal portion and ending at a tip.

At the tip, the upper surface of each finger may employ an optional pad 94 for supporting a substrate held by the shuttle. The pads 94 may be made of a material such as a ceramic, stainless steel or other metals, quartz, or other such materials.

It should be noted that the temperature requirements of the substrate transfer shuttle components may be lower than in prior systems. In many prior systems, such as cluster tools, substrates would be removed from a heating chamber by a vacuum robot which would then transport the substrate to a processing chamber, resulting in cooling of the substrate. A solution was to overheat the substrate, intending for it to cool when transported.

In the present invention, the substrate transfer shuttle 70 moves the substrate into a processing chamber directly from the heating load lock chamber 50. Thus, the requirement for overheating the substrate is alleviated if not eliminated.

FIG. 5 also shows inner and outer walls 38B and 38A, respectively. A slot 38C is located in inner wall 38B to allow the flat rail 75 of the shuttle to extend into the opening in wall 38B to engage rollers 98. In this way, contamination caused by guide rollers 98 may be minimized. Further, the process performed within the chamber is kept separate from the mechanical components causing the shuttle movement.

The width of the lifting forks 66A, 66B may be close to but less than the distance between the two exterior support fingers 88A and 88B along one side of the shuttle 70. The central cut-out section of the fork should be large enough such that it does not interfere with the central support finger 86A. In the embodiment of FIGS. 2B–2C and 7E, where diagonal support fingers are employed, the width of the fork may be larger. In the embodiment of FIGS. 2B–2C and 7E, there are three support fingers associated with each side rail: a central support finger 86A, 86B and two lateral diagonal support fingers 88A, 88B.

An advantage of such a configuration is that the same support fingers may be used to support several different sizes of substrates. Moreover, the location of the support fingers is adjustable to accommodate various substrate sizes. The location of the pads 94 is also variable to accommodate different substrate sizes.

FIGS. 1, 3C, 4, and 7D show an alternate embodiment in which lateral support fingers 88A and 88B are not diagonal but rather are parallel to support fingers 86A and 86B. Other angled fingers may be used, so long as they adequately support the substrate. While support fingers of a given size have been disclosed, the support fingers which may be used in the present invention may even be shorter than those disclosed. One reason for this is that stiff substrates, such as thick glass substrates or metal substrates, do not appreciably bow under heating.

The above designs allow each shuttle to accept substrates from two directions, each 90° away from each other. First, the shuttle may accept and release substrates in a direction perpendicular to the side rails 74A and 74B. Second, the shuttle may accept release substrates in a direction parallel to the side rails 74A and 74B. In any of the embodiments, a plurality of stoppers 201 may be provided, as shown in FIGS. 2B–2C, 4–5, 7B, 7D–7E, and 8C, to ensure accurate placement of the substrate on the support fingers and to prevent accidental shifting of the substrate on the shuttle during transport. Substrates may also be centered on the fingers by using the plurality of stoppers 201. The stoppers 201 may have the general shape of an inverted truncated cone, such as an inverted frustum. An advantage of the embodiment of FIGS. 2B–2C is that stoppers 201 prevent any movement along the plane of the substrate. In the embodiment of FIGS. 1, 3C, 4, and 7D, the substrate may still move in the x-direction as defined by FIG. 1.

Along each side of the island (FIGS. 1, 3A–3B, 5, 7A–7C, and 7F), each load lock chamber and each processing chamber includes a number of pairs of guide rollers 98 positioned so as to provide support and guidance to the shuttles as the shuttles pass through the chambers. The guide rollers 98 may be Teflon®-coated Aluminum, Vespel®, or any other such material that is not particulate-generating and is soft for dampening vibrations. Alternatively, suspensions may be employed to provide a smooth movement.

The guide rollers are all at substantially even level and define a fixed path along which the shuttles may move back and forth. The guide rollers are configured to engage the flat inboard portion 78 of the underside of each rack as a shuttle passes over the guide rollers so as to position and orient the shuttle and provide smooth shuttle movement along the predefined path.

As noted above, in order for the shuttles to stay resident within a process chamber during processing, the length of each shuttle must be less than the length of the process chamber, in order that the valves may be closed during processing. As the entire length of the shuttle is within a process chamber, the process chamber itself must contain drive mechanisms to propel the shuttle. FIGS. 3A and 3B show two alternative ways of accomplishing this. In FIG. 3A (as well as in FIGS. 6A–6B and 8A–8B), one set of drive mechanisms (100, 100', 100'', etc.) are located in the housings between each set of gate valves, e.g., 58A and 56B, while another set of drive mechanisms (101, 101', 101'', etc.) are located roughly in the center of each chamber.

In FIG. 3B (as well as in FIGS. 7A–7C and 9A–9C), chambers 50, 52, and 54A–54C are each shown with two drive mechanisms (100 and 101, 100' and 101', etc.) located roughly equidistantly from each other and from the walls of the chamber.

In either embodiment, shuttles having a length less than the length of the processing chambers may be driven and propelled from one chamber to an adjacent chamber without suffering from lack of contact of a drive mechanism. Details of a synchronization scheme for such a system are disclosed in U.S. patent application entitled "Method and Apparatus for Substrate Transfer and Processing" [attorney docket 2519/US/AKT (05542/235001)], incorporated by reference above.

As shown in FIG. 6A, each drive mechanism 100 includes a motor 102 external to the interior cavity of the associated chamber and coupled to a drive shaft assembly 104 extending into and within the interior of a chamber or a valve housing. The inner chamber wall 38B is not shown for clarity. The drive shaft assembly 104 may employ vacuum-compatible rotary feedthroughs. The drive shaft assembly carries first and second pinion gears 106A and 106B adjacent first and second sides of the associated chamber, and first and second guide rollers 108A and 108B immediately inboard of the first and second pinion gears, respectively. Guide rollers 108A and 108B may be in addition to guide rollers 98. The pinion gears may have, e.g., 16 teeth per pinion and are configured to mesh with the toothed outboard portions 33 of the racks while the guide rollers are configured to contact the smooth surface of the inboard portion of the racks of a shuttle passing over the drive mechanism (see also FIGS. 4 and 5). Optionally, the drive mechanisms 100 may each include an encoder 110 which provides input to a control system 111 responsive to rotation of the associated drive shaft assembly. The control system 111 may be connected to any and each of the various chambers for controlling their operations as well as the operation of any handling or processing equipment external to the island. The control system may comprise a user-programmable computer or other numerical controller incorporating appropriate software or firmware.

FIG. 6B shows an alternate configuration in which no drive shaft is employed. In this configuration, the shuttle is driven from one side only, and the motor may drive a pinion gear 106 without using the drive shaft assembly 104. Laterally positioned guide rollers 203 may be used in addition to guide rollers 108A and 108B to ensure that the shuttle moves in a straight horizontal direction and is not caused to misalign due to its only being driven on one side. Guide rollers 203 are positioned on each side of a guide rail 112 to ensure that the shuttle moves in a straight controlled manner.

In either of these embodiments, it should be noted that it is not crucial that the guide rollers be inboard of the pinion gears. In fact, in an alternative embodiment, the guide rollers may be outboard of the pinion gears or the relative position may be different on each side of a line of chambers. In yet another embodiment, rollers may be placed on the substrate transfer shuttle and a smooth flat ridge may be located along each side of a line of chambers to support the shuttle guide rollers.

FIG. 3C shows a six-chamber configuration having load locks 50 and 52, and six processing chambers 54A–54F. In this configuration, with one load lock on each end, a total of seven shuttles 70, 70A–70E, and 72 may be employed. The minimum number of shuttles to achieve most of the advantages of the present invention is two, and the maximum is generally n+1, where n is the number of processing chambers. In such a configuration, the shuttle movement is generally such that whenever a shuttle is adjacent an empty chamber (and generally two shuttles meet this description), the adjacent shuttle services the empty chamber in the next step of the process.

It is noted here that the configuration shown has all shuttles being of a length less than that of a processing chamber. Another embodiment may be used in which shuttles 70A–70E have lengths less than that of the processing chambers, but in which shuttles 70 and 72, servicing the load locks, are longer than the processing chamber. Such shuttles are of the type disclosed in the U.S. patent application for a "Substrate Transfer Shuttle", [attorney docket number 2688/US/AKT (05542/265001)], incorporated by reference above. In this embodiment, the shuttles 70 and 72 are longer than the process chambers but nevertheless may fit into the load locks by virtue of a set of alcoves in the load locks into which the rails of the shuttle may be housed. This increases the effective length of the load locks.

Of course, in this embodiment, during processing, the shuttles 70 and 72 may not stay resident in the process chambers—they must stay resident in the load locks.

As illustrated in FIG. 3C, load lock 50 is the empty chamber. A shuttle is resident in each of the other chambers and a substrate is in the process of being removed from load lock 52. The next step then would be to move shuttle 70 into load lock 50 to accept a new substrate from the end effector 64A (not shown).

In many processes, all of the gate valves may open simultaneously, and all but one of the shuttles may move in unison. This is because, often, one shuttle is located in a load lock (either entrance or exit) while the rest are contiguously positioned in the processing chambers. In the above case, as shuttle 70 moves into load lock 50, all of the shuttles 70A–70E may simultaneously move to the left (i.e., the "upstream" direction), assuming the substrate had been removed from the shuttle 72 in load lock 52.

In this example process, all of the shuttles may move to the left (relative to the position in FIG. 3C) so that a shuttle is resident in each chamber except the load lock 52 (the unloading load lock). A substrate may then be loaded on a shuttle in load lock 50. This substrate is then shuttled into process chamber 54A by moving all of the shuttles to the right (the "downstream" direction). The substrate may then be loaded onto a platen in chamber 54A after which all of the shuttles may be shifted to the left again. A process may be run in chamber 54A during which time another substrate is loaded onto the shuttle in the load lock 50. The shuttle in chamber 54A then engages the processed substrate, after which all of the shuttles may be shifted to the right. In this example, the processed substrate is then subjected to a next step of the process in processing chamber 54B, and the unprocessed (just loaded) substrate is subjected to the process of processing chamber 54A. Of course, this process may continue for each of the chambers 54B–54F.

In the following discussion, the placement of a substrate into a load lock chamber is described with respect to FIGS. 7A–7E. In the discussion of FIGS. 7A–7E, the support on which the substrate is placed is referred to as a platen. The platen has slots through which fingers of the shuttle may move when transferring substrates. The placement of a substrate onto a platen in a process chamber from a load lock chamber is performed in an analogous way.

As shown in FIGS. 7A–7C, each load lock chamber 50, 52 (only chamber 50 is shown) includes a platen 120 for supporting a substrate during heating or cooling prior to or after processing. Here, as discussed above, the term "chamber" refers to either a load lock chamber or a processing chamber. Since the introduction of a substrate from a robot to the processing island is discussed, initially a load lock chamber 50 is described.

A pedestal 122 supports the platen 120 and is raisable and lowerable to raise and lower the platen 120 between a first or retracted position and a second or extended position. The platen 120 is generally rectangular and slightly larger than the plan area of the substrate 126 and has a plurality of channels 205 (FIGS. 7D and 7E) extending inwardly from the opposite sides of the platen. The channels are configured so as to accommodate the fingers (86A, 86B, 88A, 88B) of a shuttle 70 when the platen 120 is raised or lowered through such a shuttle as described below. Here, we describe a substrate transfer with respect to a substrate transfer shuttle 70. Of course, the description also applies to all other shuttles, such as shuttles 72 or 70A–70E.

Initially, the load lock chamber 50 is vacant and is shielded from the adjacent chamber 54A by the valve 56A. The load lock chamber 50 is vented to atmosphere and its slit valve 60 is opened to permit introduction of a substrate to the interior of an island. As shown in the essentially downstream view of FIG. 7A, a substrate 126 is loaded into the load lock chamber 50 by the robot end effector 66A. The end effector and substrate are inserted via a horizontal (y-direction) movement into the chamber 50 at a height at which the underside of the end effector 66A is above the fingers 88A, 88B of the shuttle 70. The end effector 66A carrying the substrate 126 is stopped with the substrate 126 located centrally above the platen and then lowered by the z-linear actuator. Eventually, the end effector 66A reaches a second height shown in FIG. 7B. During movement between the first height and the second height, the end effector 66A passes below the fingers of the shuttle, with two tines of the end effector 66A passing on each side of the central fingers 86A and 86B and just inboard of adjacent lateral support fingers 88A, 88B. When the upper surface of the end effector 66A reaches the height of the pads 94 at the tip of the fingers, the pads 94 engage the underside of the substrate 126 causing the shuttle 70 to acquire the substrate 126 from the end effector 66A. When the end effector 66A reaches the position shown in FIG. 7B, it may be withdrawn from the load lock chamber 50 via horizontal translation. Once the end effector 66A is withdrawn, the valve 60 may be closed and the chamber 50 pumped down.

The platen 120 may then be raised from its initial height in FIG. 7A to a raised height shown in FIG. 7C. During movement between the initial height and the raised height, the platen 120 passes around the fingers of the shuttle, each finger being accommodated by an associated one of the channels 205. When the upper surface of the platen 120 contacts the underside of the substrate 126, it raises the substrate 126 off of the fingers (more particularly, pads 94) to acquire the substrate 126 from the shuttle 70. With the substrate 126 held by the platen 120 as shown in FIG. 7C, the substrate 126 may be heated or otherwise processed. The shuttle may be maintained in the same chamber or moved to a different chamber.

After the substrate is heated or processed, the platen may be lowered and returned to the position of FIG. 7B, with the shuttle reacquiring the substrate from the platen in the process.

Referring to FIG. 7F, a multiple substrate cassette 51 may also be employed in the load lock chamber 50. By repeating the above procedure for each substrate in the multiple substrate cassette 51, the load lock chamber 50 may be used as a buffer for storage of substrates prior to processing. An elevator 53 may be used to move the multiple substrate cassette 51 in a vertical direction so that the substrate transfer shuttle may access successive substrates stored on shelves 55 within the cassette. In FIG. 7F, a shuttle 70 is shown in process chamber 54A, having delivered a substrate 126 thereto from cassette 51. The shelf within cassette 51 from which the substrate was retrieved is not shown. The elevator 53 is shown in an intermediate stage of movement between two positions from which access to shelves 55 may be achieved. The drive mechanisms 100 and 101 and guide rollers 98 are also shown.

Referring to FIGS. 8A–8B, next described is the transfer of a substrate from the load lock chamber to a platen 220 in a processing chamber 54A. Like FIG. 7C, for clarity, stoppers 201 are not shown in these figures.

As shown in FIGS. 8A–8B, each processing chamber 54A–54C (only chamber 54A is shown) includes a platen 220 for supporting a substrate 126 during heating, cooling, or other processing. A pedestal 222 supports the platen 220 and is raisable and lowerable to raise and lower the platen 220 between a first or retracted position and a second or extended position. The platen 220 is generally rectangular and slightly larger than the plan area of the substrate 126 and has a plurality of channels 206 (FIG. 8C) extending inwardly from the opposite sides of the platen 220. The channels 206 are configured so as to accommodate the fingers (86A, 86B, 88A, 88B) of a shuttle 70 when the platen 220 is raised or lowered through such a shuttle 70 as described below.

Initially, the processing chamber 54A is vacant and is shielded from the load lock chamber 50 by the valve 56A. The valve 56A is opened to permit introduction of a substrate to the processing chamber 54A. A substrate transfer shuttle 70 is moved into the processing chamber 54A by the action of the drive mechanisms 100 and 101. Once the shuttle 70 has moved into a target position in processing chamber 54A, as shown in FIGS. 8A–8B, the substrate 126 is located centrally above the platen 220. The platen 220 is raised from a lowered height (FIG. 8A) to an intermediate height shown in FIG. 8B using pedestal 222. During movement between the lowered height and the intermediate height, the platen 220 passes around the fingers of the shuttle 70, each finger being accommodated by an associated one of the channels 206 (see FIGS. 8C). When the upper surface of the platen 220 contacts the underside of the substrate 126, it raises the substrate 126 off of the fingers to acquire the substrate 126 from the shuttle 70. With the substrate 126 held by the platen 220, the substrate 126 may be processed as desired.

It is understood that the channels 206 may affect the even distribution of temperature across the platen. However, in many processes, such as the formation of thin films on solar panels, such temperature variations may be acceptable.

Once the substrate is lifted off the shuttle, the shuttle 70 may be moved to an adjoining chamber. For example, in the case where a substrate has just been moved to processing chamber 54A, the shuttle 70 may be returned to the load lock 50.

When the shuttles 70, 70A–70E, and 72 are moving, the substrates are maintained in an intermediate position, as shown in FIG. 7C. In the intermediate position, the platens 220 and 120 have raised the substrates off the fingers 88A–88B and 86A–86B but have not raised the substrates higher than the cross-members 80A, 80B. In this way, all of the shuttles may move simultaneously, each moving unimpeded by the presence of the substrates or platens. The maintenance of the substrates in this intermediate position during simultaneous movement of the shuttles is thus critical because it allows all of the shuttles to move simultaneous without striking any of the substrates.

For solar panel devices, CVD is a commonly employed process. When processing is complete and any process gases evacuated (if necessary), the valve 56A may be reopened, establishing communication between the load lock chamber 50 and the processing chamber 54A. The platen may then be lowered to return the substrate to the shuttle in a similar fashion as when delivering the substrate to the processing chamber. When the platen reaches the shuttle, support of the substrate is transferred to the shuttle fingers from the platen.

FIGS. 9A–9L show side schematic views of one embodiment of movement of substrates and shuttles within the six-chamber array of FIG. 3C. Many other such arrangements of movement are also possible. The valves between chambers are also shown. Shading within a valve indicates that the valve is closed. Lack of shading indicates that a valve is open. It should be noted that FIGS. 9A–9L are schematic and are only intended to show shuttle movement and substrate positioning. Thus, no platens are indicated nor are platen supports shown. It should be understood from the context and from the discussion below whether any given substrate is being supported by a platen or is being supported by substrate support fingers of a substrate transfer shuttle.

FIG. 9A shows a situation in which no substrates are in any chambers and all the valves are closed. Shuttles are located in all chambers except for load lock 52. In this condition, a substrate 126 may be loaded into load lock 50 as shown in FIG. 9B. Following the loading of a substrate 126 into load lock 50, the valves may be opened as indicated in FIG. 9C. FIG. 9C also shows shuttles in an intermediate condition of movement, each moving simultaneously to the right under the force of drive mechanisms 100 (here we refer to all drives 100, 101, 100', 101', etc., by the generic numeral 100 for clarity). The shuttles move such that they are resident in all chambers except load lock 50. In this case, then, the substrate 126 is located in process chamber 54A as shown in FIG. 9D.

It should be recognized that analogous movements will occur if each chamber had resident therein a substrate 126. Thus, this description is not merely for loading the substrates into an empty array, but may also be used when each chamber has a substrate within. For example, in the above description, the position of the shuttles within FIG. 9D would be an appropriate position at which to remove a processed substrate from the shuttle in the load lock 52.

Once the substrate 126 is located within process chamber 54A, the platen (not shown) within that chamber acquires the substrate 126 from the fingers (not shown) of the shuttle and raises the substrate 126 to an intermediate position (not shown) as described above. Then all the shuttles may be moved to the left so that another substrate 126 may be loaded onto a shuttle during processing of substrate 126 within processing chamber 54A. The final position after this step is shown in FIG. 9E. It should be noted that the substrate 126 in FIG. 9E is not supported by the shuttle, but rather by the platen (not shown) within that chamber.

As this point, the valves may all be closed as shown in FIG. 9F. During processing of a substrate 126 in process chamber 54A, another substrate 126' may be loaded into load lock 50 (also shown in FIG. 9F).

Following the loading of a substrate 126' into load lock 50 and the processing of substrate 126, the valves may be opened as indicated in FIG. 9G. FIG. 9G also shows shuttles in an intermediate condition of movement, each moving simultaneously to the right under the force of drive mechanisms 100. The shuttles again move such that they are resident in all chambers except load lock 50. In this case, then, after such movement to the right, the substrate 126' is located in process chamber 54A and the substrate 126 is located in process chamber 54B as shown in FIG. 9H. The rightmost shuttle is in load lock 52 as shown.

Once the substrates 126 and 126' are located within process chambers 54B and 54A, respectively, the platens within those chambers acquire the substrates from the fingers (not shown) of the shuttles and raise the substrates to an intermediate position (not shown). Then all the shuttles may be moved back to the left so that another substrate 126" may be loaded onto a shuttle during processing of substrates 126 and 126'. The final position after this step is shown in FIG. 9I.

As this point, the valves may all be closed as shown in FIG. 9J. During processing of the substrates, the substrate 126" may be loaded into load lock 50. After processing, the shuttles and substrate may again be moved to the right as shown in FIG. 9K, acquired by the platens within the processing chambers, and then again moved to the left to allow another substrate to be loaded, this final position indicated in FIG. 9L.

It is noted that the presence of components such as the drive mechanisms and the shuttles may deleteriously affect the cleanliness and vacuum of the processing chamber. However, for many processes, such as those involved in forming solar panel devices on large glass or metal substrates, the contamination caused by such components is at a tolerable level. Furthermore, it has been found that the temperature variations introduced by channels or slots 205 and 206 are also at a tolerable level for the formation of such devices. In general, the process requirements for such device formation are more lenient and the tolerances are higher than those for, e.g., TFT formation.

Advantageously, the system is configured so that certain components may be serviced or replaced with minimal disruption of the system or contamination of the system chambers. The drive motors 102 and encoders 110 may be serviced or replaced from outside the island without risk of contamination. If a drive shaft 104 or any of its associated components needs to be serviced or replaced, such operation may be performed with the valves on either side of the drive mechanism closed. Thus, the interiors of the adjacent chambers will not become contaminated from such action. Any contamination will be limited to the valve housing which may be more readily cleaned than the interior of the adjacent processing chambers.

A number of embodiments of the present invention have been described. Nevertheless, it will be understood that various modifications may be made without departing from the spirit and scope of the invention. For example, the particular processes associated with fabricating a given device may advantageously be associated with different chamber arrangements and sequences of use. In this way, the types of chambers which may be employed include those used for etching processes, physical vapor deposition, chemical vapor deposition, etc. In another modification, while three and six process chambers have been described here, the system may employ a single process chamber, two process chambers, or any number of process chambers. The system of the present invention, as it is modular and incremental, allows numerous modifications to suit any particular process. For example, the shuttle of the present invention may be controlled to even repeat processing steps for a particular substrate if desired. In this way, the shuttle may be controlled to be bidirectional. Accordingly, other embodiments are within the scope of the following claims.

What is claimed is:

1. An apparatus for processing a substrate, comprising:
    a load lock chamber;
    a processing chamber coupled to the load lock chamber, said processing chamber including a moveable platen to support the substrate during performance of the process, said platen including slots; and
    a substrate transfer shuttle moveable along a shuttle path between one position in the load lock chamber and another position in the processing chamber for transferring the substrate between the load lock chamber and the processing chamber, the substrate transfer shuttle including a plurality of substrate supports to support the substrate during transfer of the substrate from the load lock chamber to the processing chamber, said plurality of substrate supports arranged to pass through the slots in the platen as the platen is moved in a vertical direction between a first position and a second position, the substrate transfer shuttle maintainable in the processing chamber during performance of the process, wherein the substrate transfer shuttle has first and second sides and includes:
    first and second longitudinal side rails at the respective first and second sides thereof;
    and wherein said substrate supports include:
        a first plurality of substrate support elements extending inwardly from the first longitudinal side rail; each plurality of substrate support elements having a proximal portion extending at least in part upwardly from the first longitudinal side rail and a distal portion extending inwardly from the proximal portion so that when the substrate transfer shuttle is supporting a substrate, an end effector may be accommodated vertically between the substrate and the first longitudinal side rail and laterally between at least some of the proximal portions of the substrate support elements; and
        a second plurality of substrate support elements extending inwardly from the second longitudinal side rail.

2. The apparatus of claim 1, wherein said end effector includes tines of a substrate transfer fork.

3. The apparatus of claim 3, wherein the second plurality of substrate support elements, each have a proximal portion extending at least in part upwardly from the second longitudinal side rail and a distal portion extending inwardly from the proximal portion.

4. The apparatus of claim 3, wherein the distal portions of the substrate support elements are parallel to each other.

5. The apparatus of claim 3, wherein the distal portions of the substrate support elements each further include at least one stopper to secure the substrate against lateral movement.

6. The apparatus of claim 3, wherein at least one of the distal portions of the substrate support elements is at an angle with respect to at least another of the distal portions of the substrate support elements.

7. The apparatus of claim 6, wherein the angle is between about 30° and 60°.

* * * * *